(12) United States Patent
Terada

(10) Patent No.: US 7,589,947 B2
(45) Date of Patent: Sep. 15, 2009

(54) SURGE ABSORPTION CIRCUIT

(75) Inventor: Yuji Terada, Tokyo (JP)

(73) Assignee: TDK Corporation, Tokyo (JP)

( * ) Notice: Subject to any disclaimer, the term of this patent is extended or adjusted under 35 U.S.C. 154(b) by 391 days.

(21) Appl. No.: 11/453,835

(22) Filed: Jun. 16, 2006

(65) Prior Publication Data

US 2006/0291128 A1 Dec. 28, 2006

(30) Foreign Application Priority Data

Jun. 24, 2005 (JP) ............................ P2005-185190

(51) Int. Cl.
*H02H 3/22* (2006.01)
(52) U.S. Cl. .................................... 361/111
(58) Field of Classification Search ................. 361/111
See application file for complete search history.

(56) References Cited

U.S. PATENT DOCUMENTS

| 4,271,446 A * | 6/1981 | Comstock | 361/56 |
| 4,587,588 A * | 5/1986 | Goldstein | 361/54 |
| 5,142,278 A * | 8/1992 | Moallemi et al. | 340/436 |
| 5,172,310 A * | 12/1992 | Deam et al. | 363/144 |
| 5,379,177 A * | 1/1995 | Bird | 361/118 |
| 5,388,021 A * | 2/1995 | Stahl | 361/56 |
| 5,712,755 A * | 1/1998 | Glaser et al. | 361/119 |
| 6,310,959 B1 * | 10/2001 | Alexander | 381/99 |
| 6,473,510 B1 | 10/2002 | Marsh | |
| 6,560,086 B2 * | 5/2003 | Mechanic | 361/111 |

FOREIGN PATENT DOCUMENTS

| JP | A-63-0302726 | 12/1988 |
| JP | A 2001-60838 | 3/2001 |
| KR | 10-0534058 | 12/2005 |

* cited by examiner

*Primary Examiner*—Stephen W Jackson
*Assistant Examiner*—Ann T Hoang
(74) *Attorney, Agent, or Firm*—Oliff & Berridge, PLC

(57) ABSTRACT

A surge absorption circuit in accordance with an embodiment comprises: a pair of input terminals; a pair of output terminals; a first inductor device connecting one of the pair of input terminals and one of the pair of output terminals to each other; a second inductor device connecting the other of the pair of input terminals and the other of the pair of output terminals to each other; a first surge absorption part having a first surge absorbing device and connected in series between the one of the pair of input terminals and the other of the pair of output terminals; and a second surge absorption part having a second surge absorbing device and connected in series between the other of the pair of input terminals and the one of the pair of output terminals.

1 Claim, 24 Drawing Sheets

SURGE ABSORPTION CIRCUIT

BACKGROUND OF THE INVENTION

1. Field of the Invention

The present invention relates to a surge absorption circuit with an improved high-frequency characteristic.

2. Related Background of the Invention

Since semiconductor devices such as IC and LSI are destroyed or caused to deteriorate their properties by high-voltage static electricity, surge absorbing devices such as varistors have been in use as measures against static electricity. The surge absorbing devices such as varistors have a stray capacitance component and an equivalent series inductance component, and thus deteriorate signals when employed in circuits dealing with high-speed signals.

FIG. 1 is a diagram showing an example in which a varistor is employed in a surge absorption circuit. A surge absorption circuit 100 shown in FIG. 1 comprises an I/O terminal 101, a common terminal 102, and a varistor 103. When an input signal having a small amplitude is fed to the I/O terminal 101, the varistor 103 keeps its high resistance and does not affect the input signal. On the other hand, a high-voltage surge fed to the I/O terminal 101 is let out to the common terminal 102 by the varistor 103. As a result, connecting the surge absorption circuit shown in FIG. 1 to an I/O terminal of a semiconductor device protects the semiconductor device against high-voltage surges.

FIG. 2 is a diagram showing an equivalent circuit of a varistor. As shown in FIG. 2, the varistor can be expressed equivalently by a variable resistor 104 and a stray capacitance 105, provided in parallel between one terminal and the other terminal. The variable resistor 104, which usually has a large resistance value, reduces the resistance value when a high-voltage surge is applied thereto, thereby protecting the semiconductor device against the high-voltage surge. Since the stray capacitance 105 exists, however, high-speed signals deteriorate when the varistor is added to the I/O side of a semiconductor device dealing with the high-speed signals.

FIG. 3 is a diagram showing the calculation result of S parameters S11 and S21 of the surge absorption circuit expressed by the equivalent circuit shown in FIG. 2. FIG. 3 shows the S parameters S11 and S21 when the capacitance Cz of the stray capacitance is 1 pF, 3 pF, and 5 pF, respectively. In the case where the stray capacitance 105 is 5 pF, S21 begins to deteriorate when the frequency exceeds several hundred MHz, whereby signals cannot be transmitted anymore. S11 also increases, thereby deteriorating the reflection characteristic. The same holds when the frequency exceeds 1 GHz at the stray capacitance 105 of 1 pF. The stray capacitance has a tradeoff relationship to a clamping voltage and a surge durability, which is problematic in that surge absorbing devices having a favorable characteristic for high-speed signals cannot be employed.

FIG. 4 is a diagram showing the TDR (Time Domain Reflectmetry) test result of a conventional surge absorption circuit. FIG. 4 shows TDR when the capacitance Cz of the stray capacitance is 1 pF, 3 pF, and 5 pF, respectively. When the stray capacitance is 5 pF, the input impedance with respect to a pulse signal having a rise/fall time of 200 ps and a signal amplitude of 1 $V_{0-p}$ decreases to about 40 Ω with respect to a steady state of 100 Ω. It decreases to about 80 Ω even when the stray capacitance is 1 pF.

Thus, for employing a surge absorption circuit in a circuit dealing with a high-speed signal, the rising characteristic and delay characteristic of the high-speed signal must deteriorate unless the stray capacitance component is made smaller. On the other hand, reducing the stray capacitance component of the surge absorbing device raises the clamping voltage of the surge absorbing device and decreases its surge durability.

Surge absorption circuits which alleviate influences of the stray capacitance component have already been proposed. For example, combining an inductor device with a surge absorbing device can achieve impedance matching in the surge absorption circuit. FIG. 5 is a diagram showing an example of a conventional surge absorption circuit in which two inductor devices are combined with a varistor. In a surge absorption circuit 110 shown in FIG. 5, two inductor devices 114 and 115 are connected in series between an input terminal 111 and an output terminal 112, whereas a varistor 116 is connected between a midpoint of the series circuit and a common terminal 113.

FIG. 6 is a diagram showing another example of a conventional surge absorption circuit in which an inductor device is combined with two varistors. In a surge absorption circuit 120 shown in FIG. 6, a varistor 123 is connected in series to a parallel circuit of a varistor 124 and an inductor device 125 between an I/O terminal 121 and a common terminal 122. Such a surge absorption circuit is disclosed in, for example, Japanese Patent Application Laid-open No. 2001-60838.

SUMMARY OF THE INVENTION

However, even the circuit shown in FIG. 5 cannot realize a sufficient characteristic. The input impedance $Z_{in}$ of the circuit shown in FIG. 5 is represented by the following expression (1). The varistor 116 is represented by the equivalent circuit shown in FIG. 2, and is approximated by the stray capacitance 105 of FIG. 2 alone with respect to a high-speed signal having a small amplitude.

$$Z_{in} = \sqrt{\frac{2Lz}{Cz} - \omega^2 Lz^2} \tag{1}$$

The input impedance $Z_{in}$ in the equation (1) becomes a value shown in the following equation (3) when the following expression (2-1) and the following expression (2-2) are satisfied. $Z_0$ is a characteristic impedance of a signal line into which a surge absorption circuit is inserted.

$$\frac{2Lz}{Cz} \gg \omega^2 Lz^2 \tag{2-1}$$

$$Z_0 \gg \omega Lz \tag{2-2}$$

$$Z_{in} = \sqrt{\frac{2Lz}{Cz}}. \tag{3}$$

Therefore, if an inductive device of which inductance Lz is equal to be a value shown in the following equation (4) is used, it is possible to match the input impedance to the characteristic impedance of the signal line.

$$Lz = \frac{Z_0^2 Cz}{2} \tag{4}$$

Since the conditions of expression (2-1) and expression (2-2) exists, however, it is not possible to match the input impedance to the characteristic impedance at high frequencies. Therefore, it is still necessary to reduce the stray capacitance of the varistor.

The circuit shown in FIG. 6 is also hard to attain impedance matching over a wide band, since a bandpass filter is constructed by the stray capacitance of the varistor 123 and the inductor device 125. Therefore, a sufficient characteristic cannot be realized with respect to high-speed signals.

Also, the surge absorption circuits shown in FIGS. 1, 5, and 6 are circuits which absorb surges in so-called unbalanced signal lines in which one of signal lines is grounded, and cannot be employed in differential signal lines through which differential signals are transmitted.

It is an object of the present invention to provide a surge absorption circuit which is excellent in impedance matching with respect to high-speed differential signals of differential inputs as well.

A surge absorption circuit in accordance with the present invention cancels the influence of the stray capacitance component of a surge absorbing device by utilizing an inductor device.

Specifically, the surge absorption circuit of the present invention is a surge absorption circuit comprising a pair of input terminals and a pair of output terminals for connection to the outside, the surge absorption circuit further comprising a first inductor device connecting one of the pair of input terminals and one of the pair of output terminals to each other; a second inductor device connecting the other of the pair of input terminals and the other of the pair of output terminals to each other; a first surge absorbing device connecting one of the pair of input terminals and the other of the pair of output terminals to each other; and a second surge absorbing device connecting the other of the pair of input terminals and one of the pair of output terminals to each other.

Namely, the surge absorption circuit of the present invention comprises: a pair of input terminals; a pair of output terminals; a first inductor device connecting one of the pair of input terminals and one of the pair of output terminals to each other; a second inductor device connecting the other of the pair of input terminals and the other of the pair of output terminals to each other; a first surge absorption part having a first surge absorbing device and connected in series between the one of the pair of input terminals and the other of the pair of output terminals; and a second surge absorption part having a second surge absorbing device and connected in series between the other of the pair of input terminals and the one of the pair of output terminals.

Since the surge absorbing devices connect the input and output terminals in a crossing fashion, and values of inductor devices can be appropriately set with respect to the stray capacitance of the surge absorbing devices, the influence of the stray capacitance component in the case of differential signals can be cancelled and therefore a flat frequency characteristic over a wide band can be realized.

Accordingly, the present invention can provide a surge absorption circuit which is excellent in impedance matching with respect to high-speed differential signals as well while protecting semiconductor devices and the like against high-voltage static electricity.

The surge absorption circuit in accordance with the present invention further connects a resistor device or inductor device in series to the surge absorbing devices, so as to cancel the influence of the equivalent parallel resistance component or stray capacitance component of the inductor device.

Specifically, the surge absorption circuit of the present invention can be a surge absorption circuit comprising a pair of input terminals and a pair of output terminals for connection to the outside, the surge absorption circuit further comprising a first inductor device connecting one of the pair of input terminals and one of the pair of output terminals to each other; a second inductor device connecting the other of the pair of input terminals and the other of the pair of output terminals to each other; a first surge absorbing device and a first resistor device, a first surge absorbing device and a third inductor device, or a first surge absorbing device, a first resistor device, and a third inductor device which connect one of the pair of input terminals and the other of the pair of output terminals to each other in series; and a second surge absorbing device and a second resistor device, a second surge absorbing device and a fourth inductor device, or a second surge absorbing device, a second resistor device, and a fourth inductor device which connect the other of the pair of input terminals and one of the pair of output terminals to each other in series.

Namely, in the surge absorption circuit of the present invention, the first surge absorption part can have a resistor device and/or an inductor device connected in series to the first surge absorbing device. In addition, in the surge absorption circuit of the present invention, the second surge absorption part can have a resistor device and/or an inductor device connected in series to the second surge absorbing device.

Connecting the resistor device or inductor device in series to the surge absorbing device can cancel the equivalent parallel resistance component or equivalent parallel capacitance component of the inductor device in the case of differential signals, thereby realizing a flat frequency characteristic over a wide band.

In the surge absorption circuit of the present invention, a resistor device or capacitor device may further be connected in parallel to the first inductor device and/or the second inductor device.

Specifically, a third resistor device, a first capacitor device, or a third resistor device and a first capacitor device connected in parallel are connected in parallel to the first inductor device; and a fourth resistor device, a second capacitor device, or a fourth resistor device and a second capacitor device connected in parallel are connected in parallel to the second inductor device.

Namely, the surge absorption circuit of the present invention can further comprises a resistor device and/or a capacitor device connected in parallel to the first inductor device. In addition, the surge absorption circuit of the present invention can further comprises a resistor device and/or a capacitor device connected in parallel to the second inductor device.

Connecting a resistor device or capacitor device in parallel to the inductor device can cancel the influence of the equivalent series resistance component or equivalent series inductance component of the surge absorbing device in the case of differential signals, thereby realizing a flat frequency characteristic over a wide band.

In the above-mentioned surge absorption circuit of the present invention, two inductor devices which connect the input and output terminals to each other may be inductively coupled to each other such that magnetic fluxes strengthen each other against an input of a common-mode signal.

Specifically, in the above-mentioned surge absorption circuit of the present invention, the first inductor device and the second inductor device are inductively coupled to each other such that magnetic fluxes strengthen each other against an input of a common-mode signal to the pair of input terminals.

The inductive coupling can eliminate common-mode noise, and can realize a flat frequency characteristic over a wide band in the case of differential signals.

DESCRIPTION OF THE PREFERRED EMBODIMENTS

With reference to the accompanying drawings, embodiments of the present invention will be explained. The embodiments explained in the following are examples of structures of the present invention and would not restrict the present invention.

Though the following embodiments describe a varistor as a typical example of surge absorbing devices, the same operation and effect are exhibited when the varistor is replaced with other surge absorbing devices as a matter of course.

First Embodiment

Figure 7:
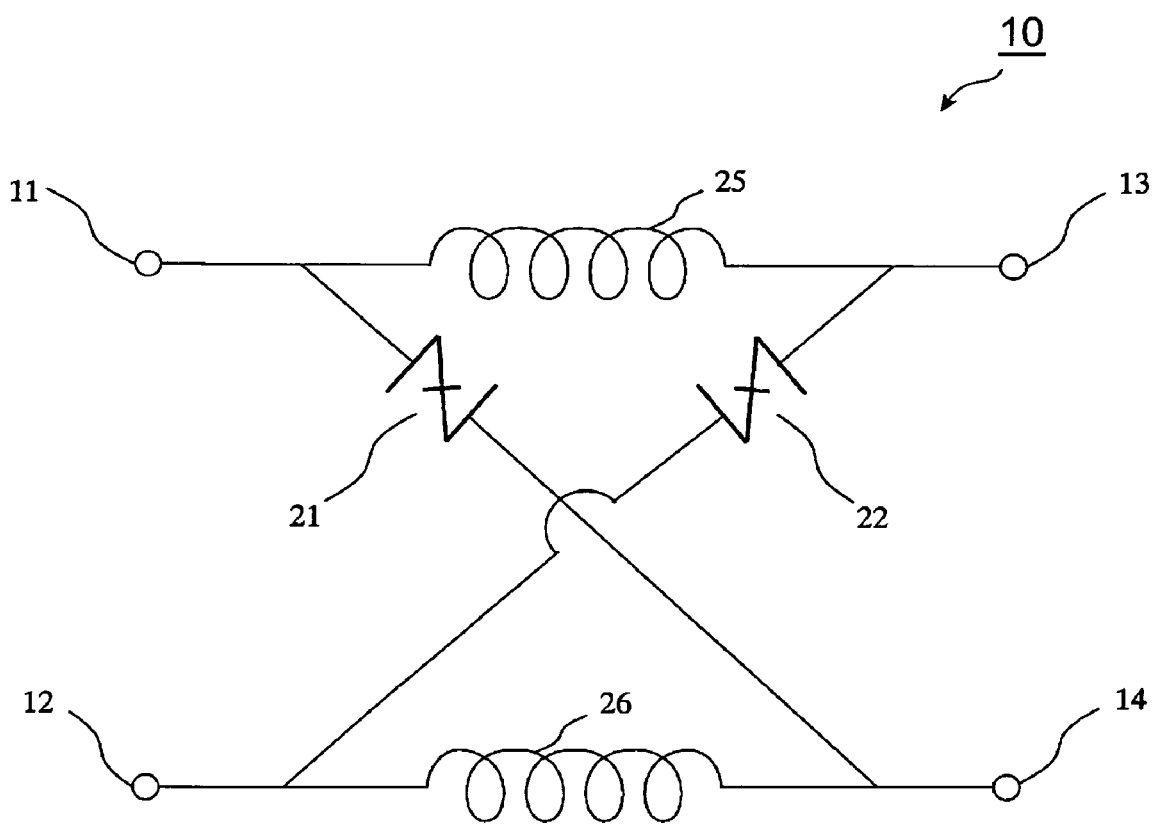
FIG. 7 is a diagram showing the circuit structure of the surge absorption circuit in accordance with an embodiment of the present invention.

FIG. 7 shows the circuit structure of the surge absorption circuit in accordance with an embodiment of the present invention. A surge absorption circuit 10 shown in FIG. 7 comprises one input terminal 11 of differential input terminals, the other input terminal 12 of the differential input terminals, one output terminal 13 of differential output terminals, the other output terminal 14 of the differential output terminals, a first surge absorbing device 21, a second surge absorbing device 22, a first inductor device 25, and a second inductor device 26.

As shown in FIG. 7, the surge absorption circuit 10 comprises a pair of input terminals 11 and 12 and a pair of output terminals 13 and 14 for connection to the outside. The first inductor device 25 is connected between the input terminal 11 and output terminal 13, whereas the second inductor device 26 is connected between the input terminal 12 and output terminal 14. The first surge absorbing device 21 is connected between the input terminal 11 and output terminal 14, whereas the second surge absorbing device 22 is connected between the input terminal 12 and output terminal 13.

Employable as the first surge absorbing device 21 or second surge absorbing device 22 are a varistor utilizing a metal oxide such as ZnO, a PN junction device utilizing a semiconductor such as Si, a surge absorbing device utilizing molybdenum, a gap-type discharge device utilizing a discharge between electrodes, and the like.

Though the pair of input terminals 11 and 12 and the pair of output terminals 13 and 14 are distinguished from each other here, the input and output sides are interchangeable. The coefficient of induction (inductance) of each of the first inductor device 25 and second inductor device 26 is Lz.

Figure 1:
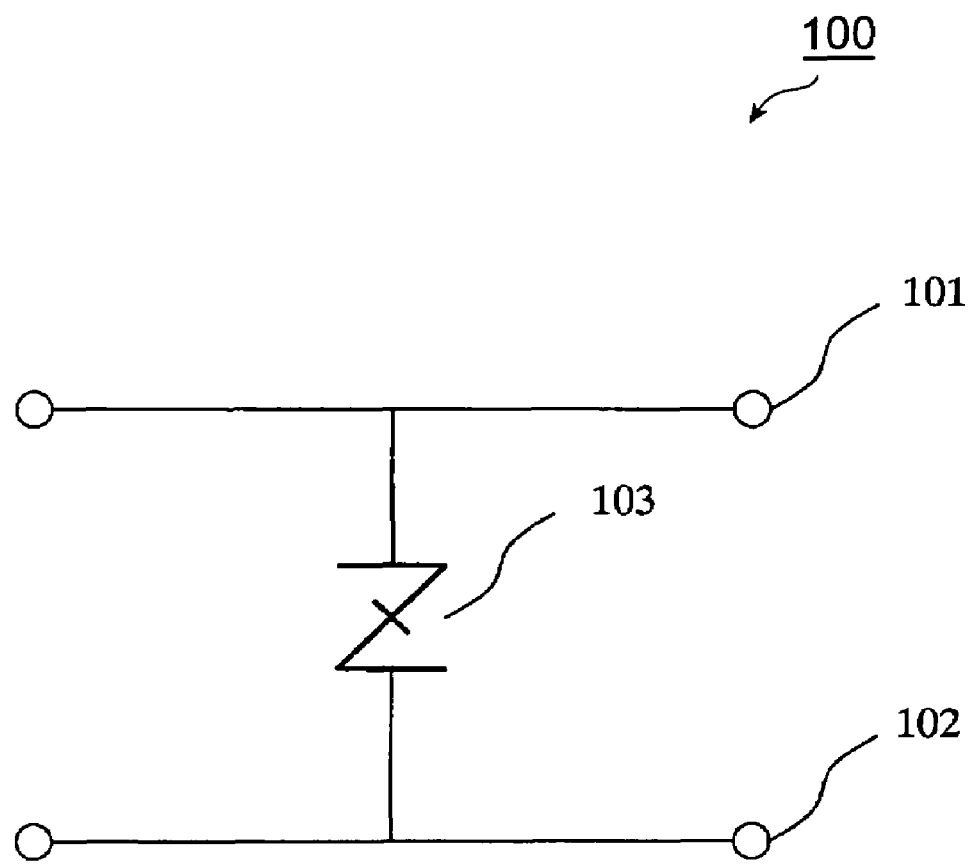
FIG. 1 is a diagram showing a conventional example in which a varistor is employed in a surge absorption circuit.
Figure 2:
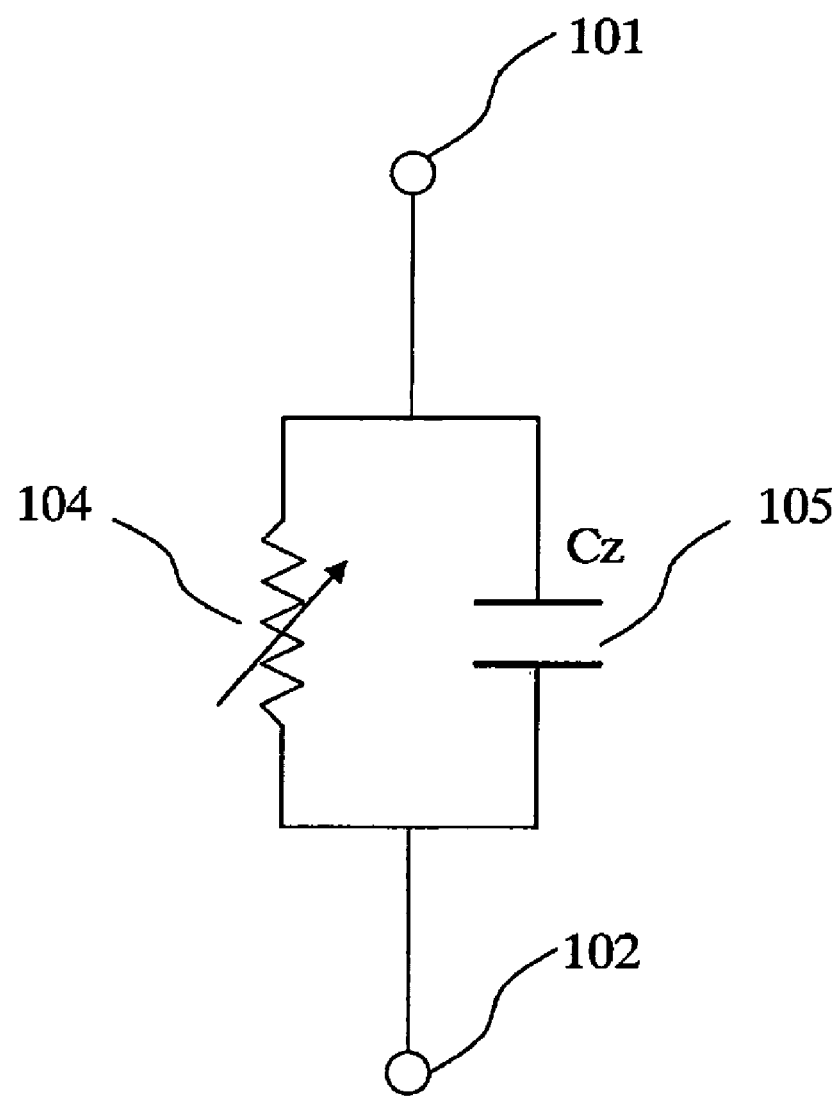
FIG. 2 is a diagram showing the equivalent circuit of the varistor.
Figure 3:
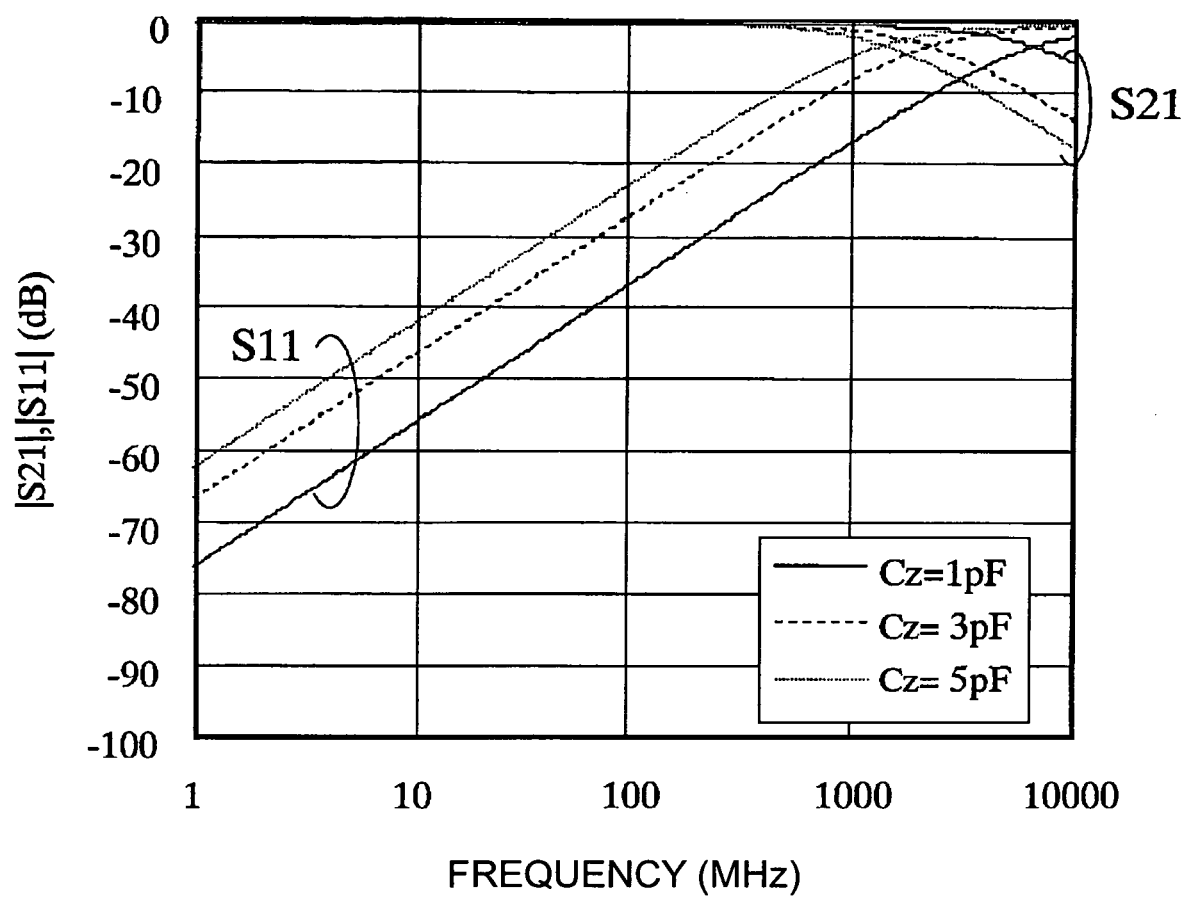
FIG. 3 is a chart explaining S-parameters of a conventional surge absorption circuit.
Figure 4:
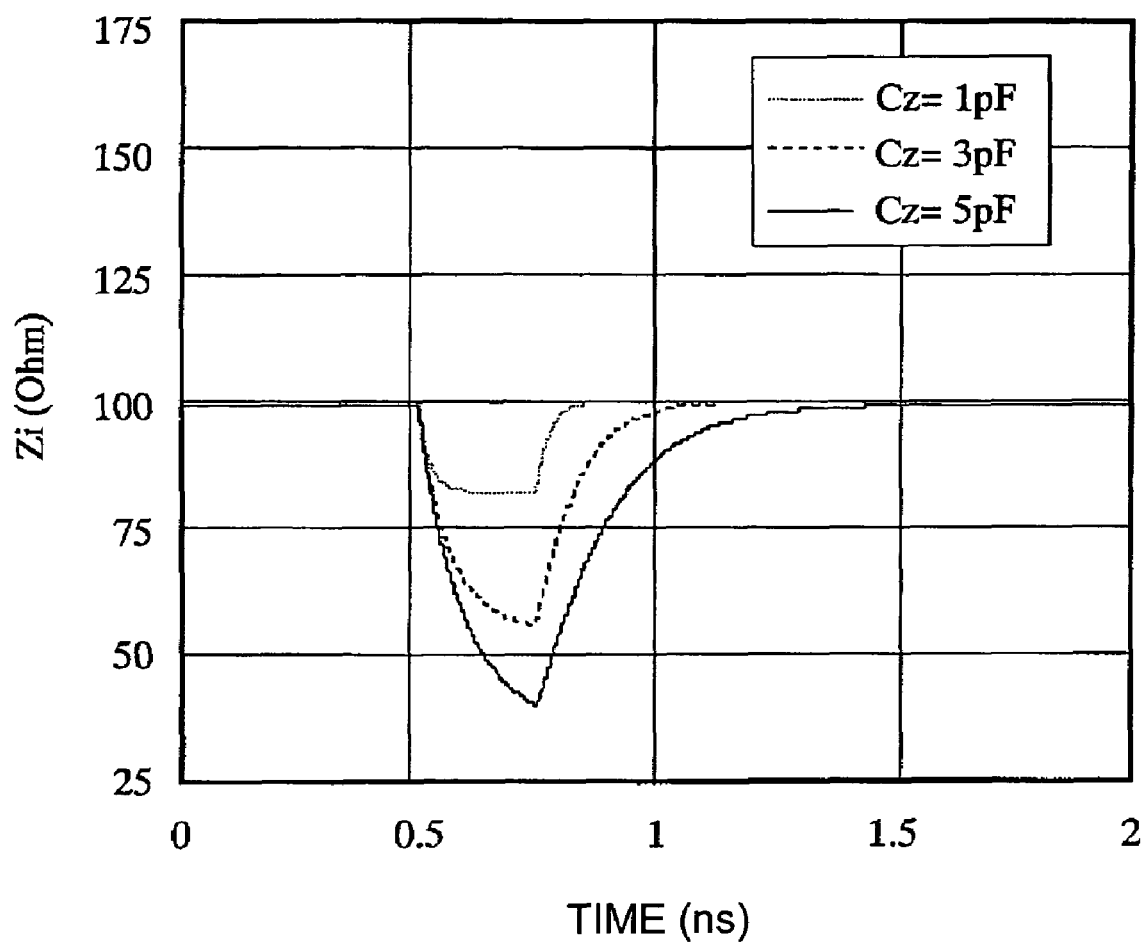
FIG. 4 is a chart showing TDR test results of the conventional surge absorption circuit.
Figure 5:
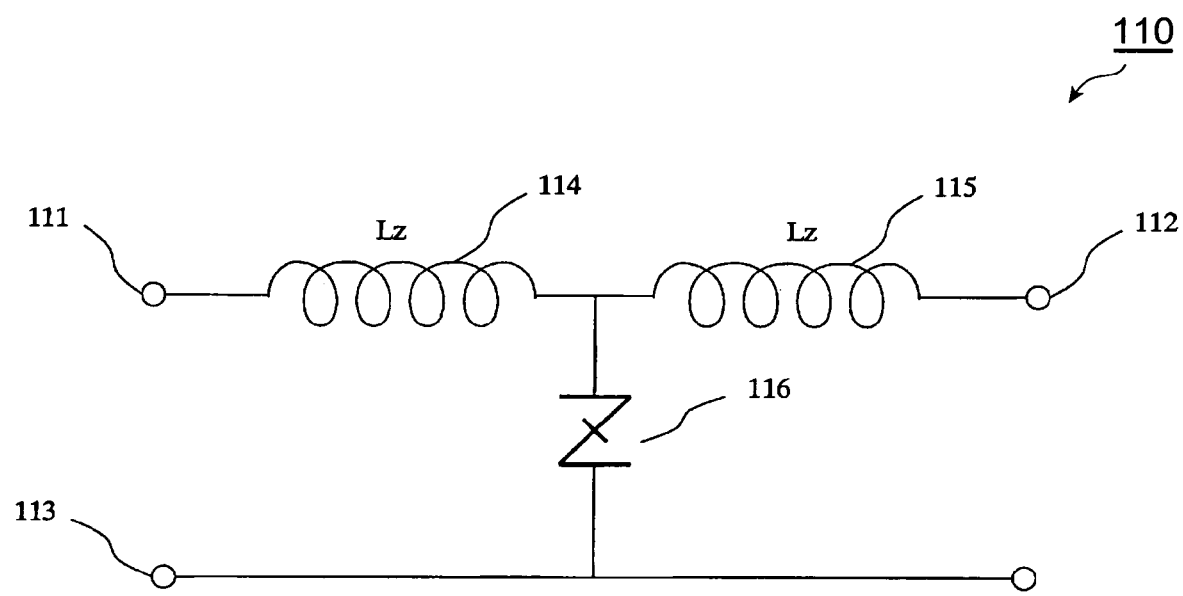
FIG. 5 is a diagram showing an example of conventional surge absorption circuit combining two inductor devices with a varistor.
Figure 6:
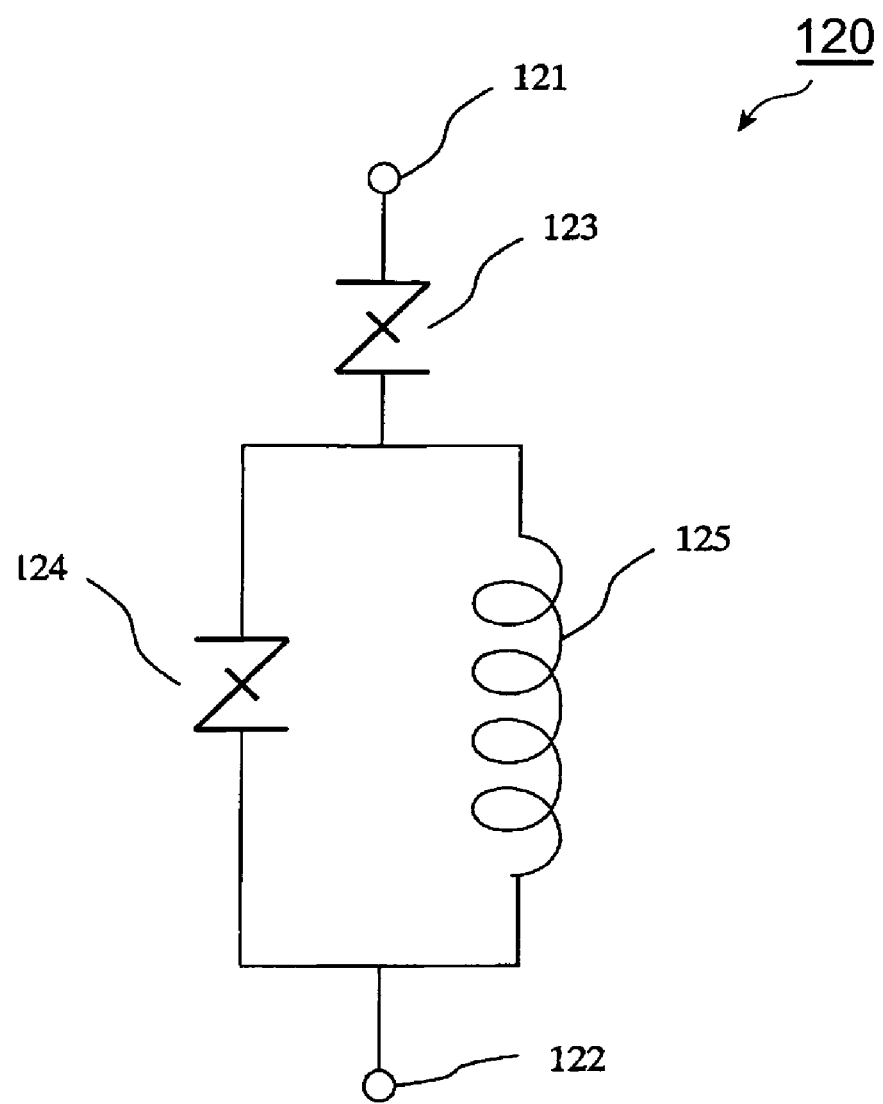
FIG. 6 is a diagram showing an example of conventional surge absorption circuit combining an inductor device with two varistors.

The differential input impedance $Z_{din}$ of the surge absorption circuit 10 in FIG. 7 is represented by the following expression (5). Here, the first surge absorbing device 21 and second surge absorbing device 22 are represented by the equivalent circuit shown in FIG. 2, and are approximated by the stray capacitance 105 of the capacitance Cz in FIG. 2 alone with respect to high-speed differential signals having a small amplitude.

$$Z_{din} = \sqrt{\frac{Lz}{Cz}} \tag{5}$$

As shown in expression (5), the differential input impedance $Z_{din}$ of the surge absorption circuit 10 is constant without depending on frequency. When the following expression (6) is satisfied, the differential input impedance $Z_{din}$ of the surge absorption circuit 10 is matched with the differential characteristic impedance $Z_{do}$ of a signal line in which the surge absorption circuit is inserted.

$$Lz = Z_{do}^2 CZ \qquad (6)$$

Therefore, the surge absorption circuit of this embodiment can become a surge absorption circuit which is excellent in impedance matching with respect to high-speed differential signals as well while protecting semiconductor devices and the like against high-voltage static electricity.

An example in which the surge absorption circuit explained with FIG. 7 is realized as a multilayer surge absorption component will now be explained.

Figure 8:
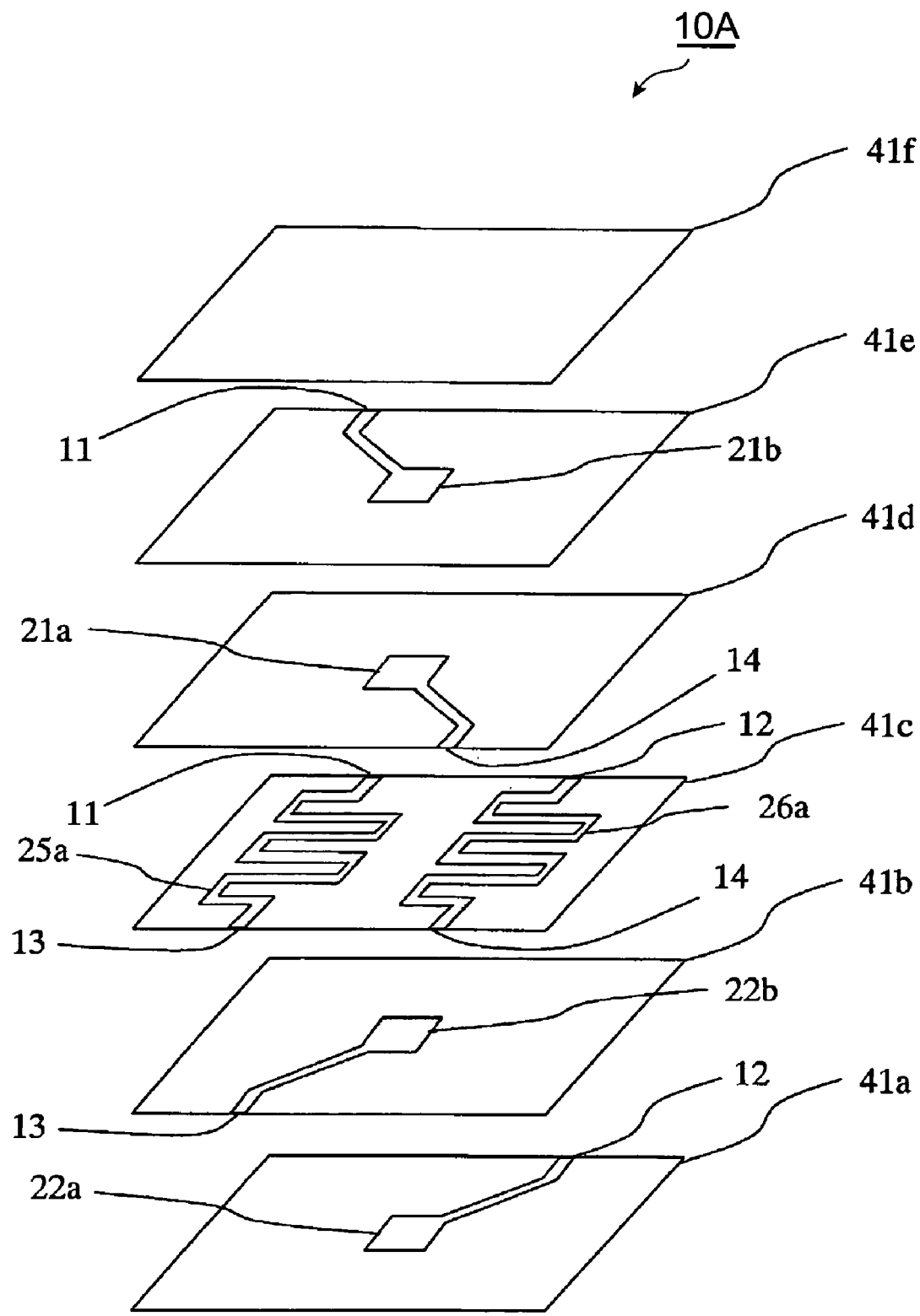
FIG. 8 is a view showing an example in which a multilayer surge absorption component realizing a surge absorption circuit as a multilayer component is exploded into individual layers.

FIG. 8 shows an example in which a multilayer surge absorption component realizing the surge absorption circuit explained with FIG. 7 as a multilayer component is exploded into individual layers. As shown in FIG. 8, a multilayer surge absorption component 10A comprises: one input terminal 11 of differential input terminals; the other input terminal 12 of the differential input terminals; one output terminal 13 of differential output terminals; the other input terminal 14 of the differential output terminals; first surge absorbing device patterns 21a and 21b; second surge absorbing device patterns 22a and 22b; a first inductor device pattern 25a; a second inductor device pattern 26a; and planar insulating layers 41a, 41b, 41c, 41d, 41e, and 41f.

Figure 9:
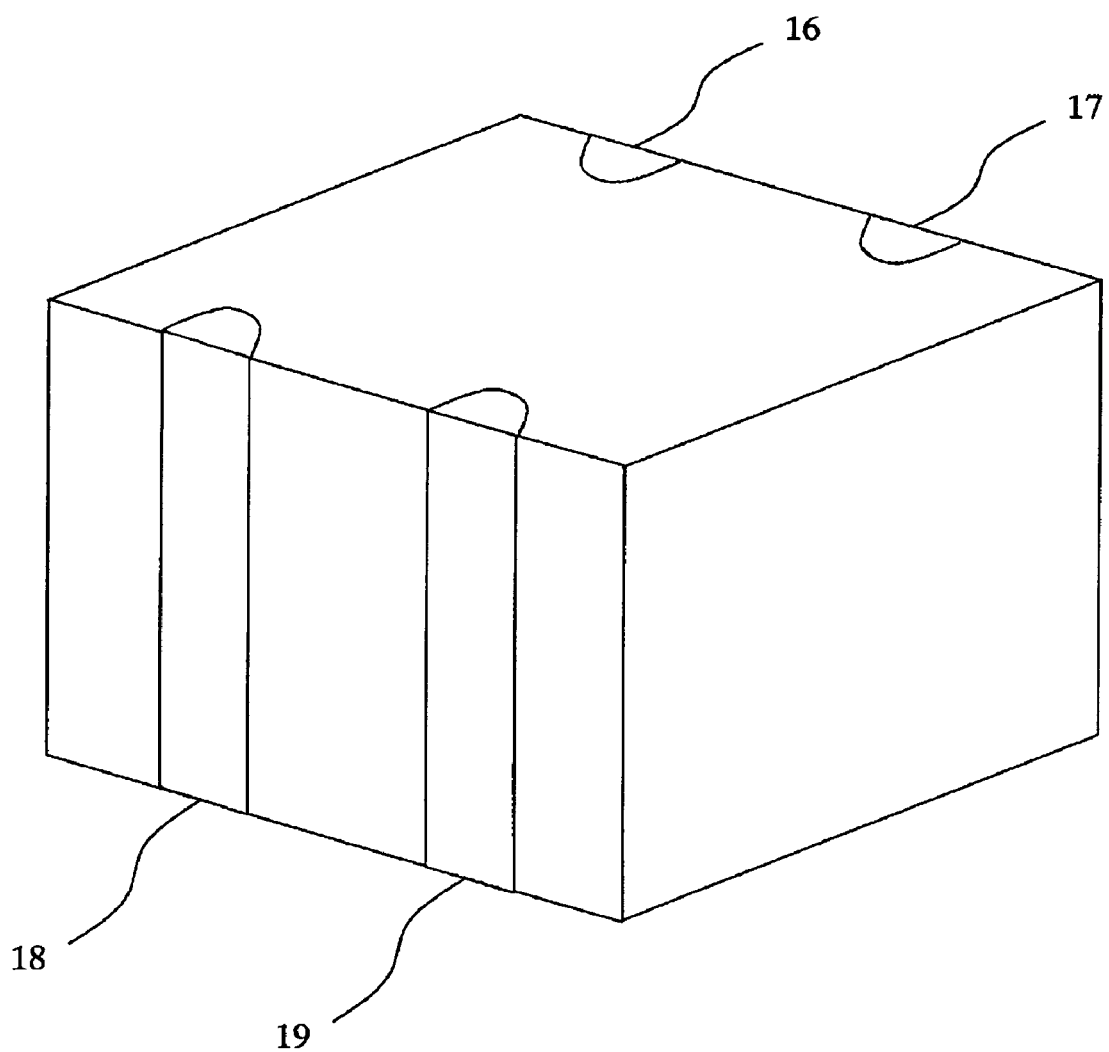
FIG. 9 is a view showing the outer shape of the multilayer surge absorption component.

FIG. 9 shows the outer shape of the multilayer surge absorption component explained with FIG. 8. As shown in FIG. 9, the multilayer surge absorption component 10A further comprise: a first input electrode 16 to which one input terminal 11 in the pair of input terminals is connected; a second input electrode 17 to which the other input terminal 12 in the pair of input terminals is connected; a first output electrode 18 to which one output terminal 13 in the pair of output terminals is connected; a second output electrode 19 to which the other output terminal 14 in the pair of output terminals is connected. The first surge absorbing device pattern 21b and first inductor device pattern 25a are connected to the first input electrode 16, the second inductor device pattern 26a and second surge absorbing device pattern 22a are connected to the second input electrode 17, the first inductor device pattern 25a and second surge absorbing device pattern 22b are connected to the first output electrode 18, and the first surge absorbing device pattern 21a and second inductor device pattern 26a are connected to the second output electrode 19. Though the first input electrode 16 and second input electrode 17 and the first output electrode 18 and second output electrode 19 are distinguished from each other here, the input and output sides are interchangeable.

The structures and materials of the insulating layers constituting the multilayer surge absorption component will now be explained. Employable as the insulating layers 41a, 41b, 41c, 41d, 41e, 41f are materials with enhanced insulation from surface circuits, e.g., dielectric materials such as glass epoxy resins, fluorine resins, and ceramics. The insulating layer 41e formed with the first surge absorbing device pattern 21b and the insulating layer 41b formed with the second surge absorbing device pattern 22b may be semiconductor ceramic materials mainly composed of ZnO, for example. The device patterns formed on the surfaces of the insulating layers can utilize conductors such as gold, platinum, silver, copper, lead, and their alloys, and are made by printing and etching techniques.

The surface of the insulating layer 41a is formed with the second surge absorbing device pattern 22a, whereas the input terminal 12 is connected to the second input electrode 17 provided on the surface of the multilayer surge absorption component 10A. The surface of the insulating layer 41b is formed with the second surge absorbing device pattern 22b, whereas the output terminal 13 is connected to the first output electrode 18 provided on the surface of the multilayer surge absorption component 10A. The surface of the insulating layer 41c is formed with the first inductor device pattern 25a and second inductor device pattern 26a, whereas the pair of input terminals 11 and 12 and the pair of output terminals 13 and 14 are respectively connected to the first input electrode 16, second input electrode 17, first output electrode 18, and second output electrode 19 provided on the surface of the multilayer surge absorption component 10A. The surface of the insulating layer 41d is formed with the first surge absorbing device pattern 21a, whereas the output terminal 14 is connected to the second output electrode 19 provided on the surface of the multilayer surge absorption component 10A. The surface of the insulating layer 41e is formed with the first surge absorbing device pattern 21b, whereas the input terminal 11 is connected to the first input electrode 16 provided on the surface of the multilayer surge absorption component 10A. The insulating layer 41f prevents the inner device patterns from coming into contact with the outside.

Namely, in the multilayer surge absorption component 10A, the insulating layers 41a, 41b, 41c, 41d, 41e, and 41f are stacked in order in a predetermined direction. Provided on one surface of a pair of surfaces which are defined by these insulating layers and extend in the predetermined direction are the input electrodes 16 and 17. The input electrodes 16 and 17 extend in the predetermined direction. Provided on the other surface of the pair of surfaces are the output electrodes 18 and 19. The output electrodes 18 and 19 extend in the predetermined direction.

The first surge absorbing device pattern 21b is provided on one main surface of the insulating layer 41e, and the first surge absorbing device pattern 21a is provided on one main surface of the insulating layer 41d. One end 11 (i.e. the one input terminal) of the first surge absorbing device pattern 21b is positioned along an edge of the insulating layer 41e and is connected to the input electrode 16. One end 14 (i.e. the other output terminal) of the first surge absorbing device pattern 21a is positioned along an edge of the insulating layer 41d and is connected to the output electrode 19. A portion of the first surge absorbing device pattern 21a and a portion of the first surge absorbing device pattern 21b, which face to each other via the insulating layer 41e, configure the first surge absorbing device 21.

The first inductor device pattern 25a and second inductor device pattern 26a configures the first inductor device 25 and the second inductor device 26 respectively, on one main surface of the insulating layer 41c. One end 11 and the other end 13 of the first inductor device pattern 25a are connected to the input electrode 16 and the output electrode 18, respectively. One end 12 and the other end 14 of the second inductor device pattern 26a are connected to the input electrode 17 and the output electrode 19, respectively.

The second surge absorbing device pattern 22b is provided on one main surface of the insulating layer 41b, and the second surge absorbing device pattern 22a is provided on one main surface of the insulating layer 41a. One end 12 (i.e. the other input terminal) of the second surge absorbing device pattern 22a is positioned along an edge of the insulating layer 41a and is connected to the input electrode 17. One end 13 (i.e. the one output terminal) of the second surge absorbing device pattern 22b is positioned along an edge of the insulating layer 41b and is connected to the output electrode 18. A portion of the second surge absorbing device pattern 22a and a portion of the second surge absorbing device pattern 22b, which face to each other via the insulating layer 41b, configure the second surge absorbing device 22.

Each of the first inductor device pattern 25a and second inductor device pattern 26a is formed by a single layer in this example, but may also be constructed by a plurality of layers. Forming with a plurality of layers can realize a large coefficient of induction.

The plurality of layers shown in FIG. 8 are successively laminated, bonded together under pressure, and then integrally fired, so as to produce a multilayer body as shown in FIG. 9. The surface of the multilayer body is formed with the first input electrode 16, second input electrode 17, first output electrode 18, and second output electrode 19. Employable as electrode materials are conductors such as gold, platinum, silver, copper, lead, and their alloys.

Thus completed multilayer surge absorption component is small in size and can reduce the stray capacitance, since the inductor devices and surge absorbing devices are formed integrally. Also, the circuit structure of the above-mentioned surge absorption circuit can yield a multilayer surge absorption component which is excellent in impedance matching with respect to high-speed differential signals as well while protecting semiconductor devices and the like against high-voltage static electricity.

Figure 10:
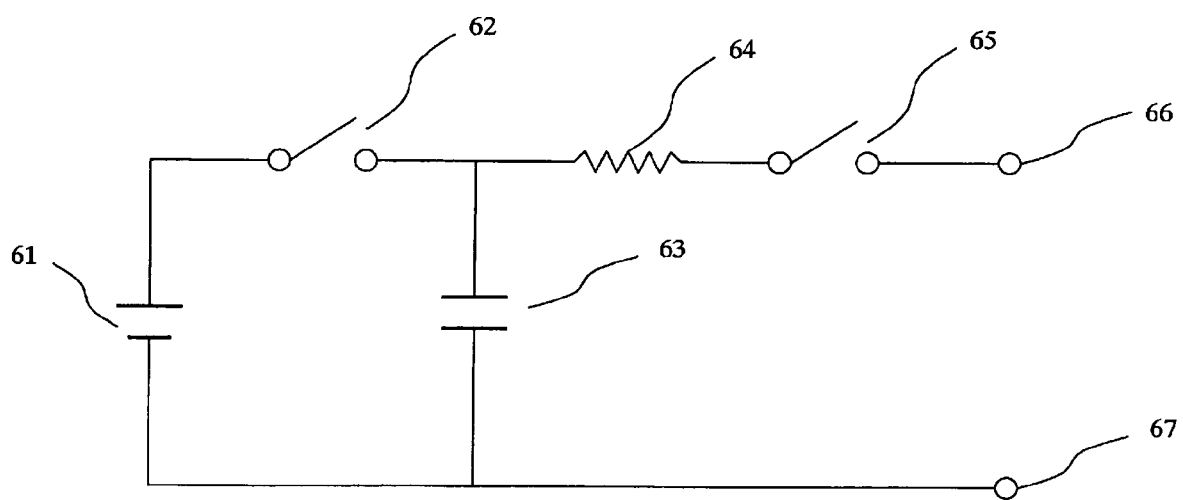
FIG. 10 is a diagram showing the circuit of a surge tester.

The above-mentioned surge absorption component 10A was subjected to a surge test. FIG. 10 shows the circuit of the surge tester at that time. The circuit shown in FIG. 10 comprises a DC voltage source 61, a switch 62, a capacitor device 63, a resistor 64, a switch 65, and output terminals 66 and 67.

One input electrode 16 in the multilayer surge absorption component shown in FIG. 9 was connected to the output terminal 66 of the surge tester shown in FIG. 10. Here, the other input terminal 17 of the multilayer surge absorption component was set to an open state, whereas the output terminal 67 of the surge tester was grounded. Each of the output electrodes 18, 19 in the multilayer surge absorption component was terminated by a 50 Ω resistor, for example. The DC voltage source 61 supplied a voltage of 2 kV, the capacitance of the capacitor device 63 was 150 pF, and the resistance value of the resistor 64 was 330 Ω.

Figure 11:
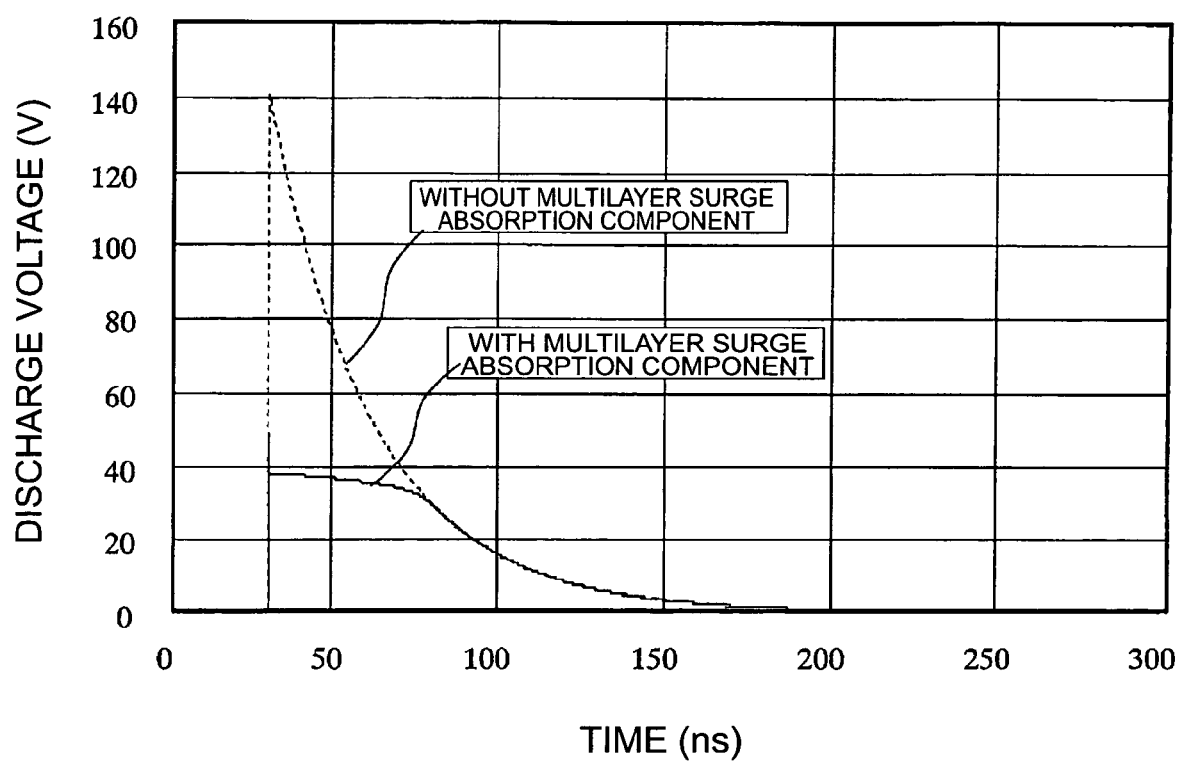
FIG. 11 is a chart showing results of measurement of the voltage applied to a load circuit constructed by the multilayer surge absorption component and a load resistor.

First, while the switch 65 was kept in the open state, the switch 62 was closed, so as to charge the capacitor device 63 with the DC voltage source 61. Subsequently, the switch 62 was opened, and the switch 65 was closed, whereby electric charges in the capacitor device 63 were fed to the input electrode 16 in the multilayer surge absorption component through the resistor 64. At that time, the voltage between the output electrodes 18 and 19 in the multilayer surge absorption component was measured. FIG. 11 shows results of measurement. FIG. 11, whose abscissa and ordinate indicate time (ns) and discharge voltage (V), respectively, compares the discharge voltages obtained with and without the multilayer surge absorption component. FIG. 11 clarifies that adding the multilayer surge absorption component of this embodiment sufficiently absorbs surges. Consequently, connecting the multilayer surge absorption component between input terminals of a semiconductor device, for example, can prevent the semiconductor device from being destroyed by a potential difference due to surges.

Figure 12:
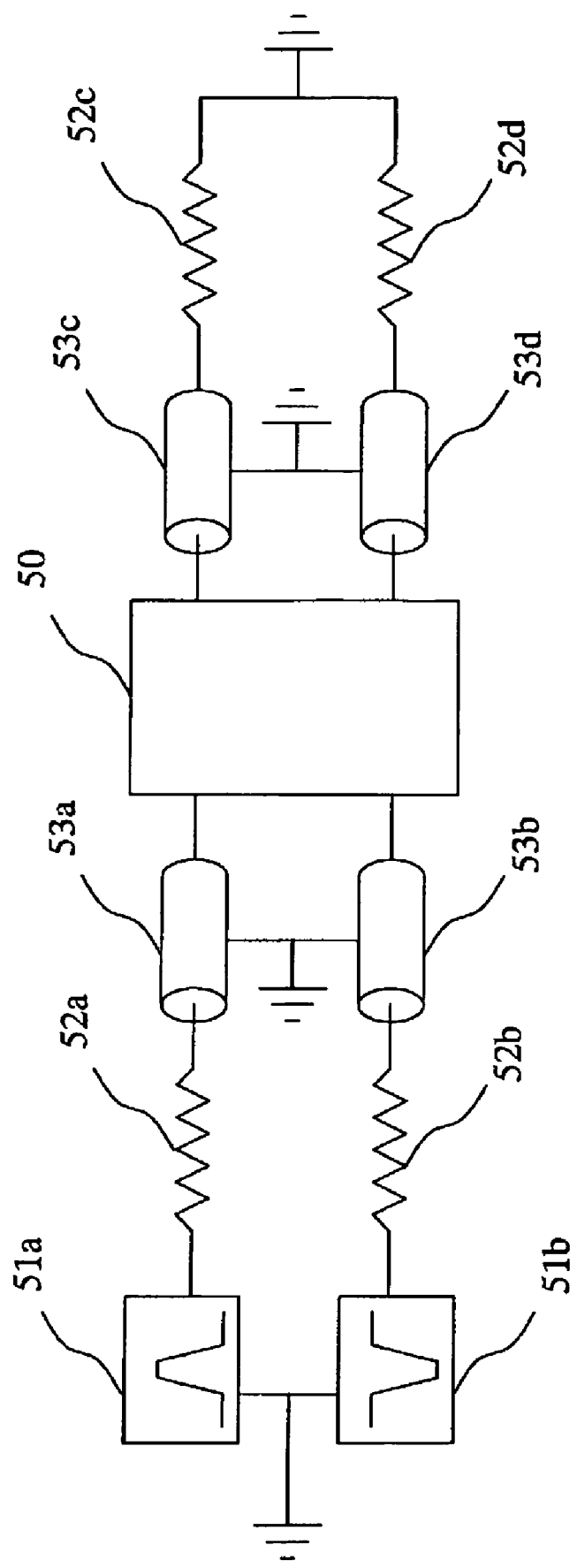
FIG. 12 is a diagram showing the structure of a TDR test system.

The above-mentioned multilayer surge absorption component was subjected to a TDR test. FIG. 12 shows the structure of the TDR test system at that time. The test system shown in FIG. 12 comprises: the multilayer surge absorption component 50 to be measured; pulse generators 51a and 51b; resistors for impedance matching 52a, 52b, 52c, and 52d; and coaxial lines 53a, 53b, 53c, and 53d.

The electrodes of the multilayer surge absorption component shown in FIG. 9 were respectively connected to four terminals as with the multilayer surge absorption component to be measured in FIG. 12. Each of the coaxial lines 53a, 53b, 53c, and 53d was 50 Ω, whereas each of the resistors for impedance matching 52a, 52b, 52c, and 52d was 50 Ω.

Figure 13:
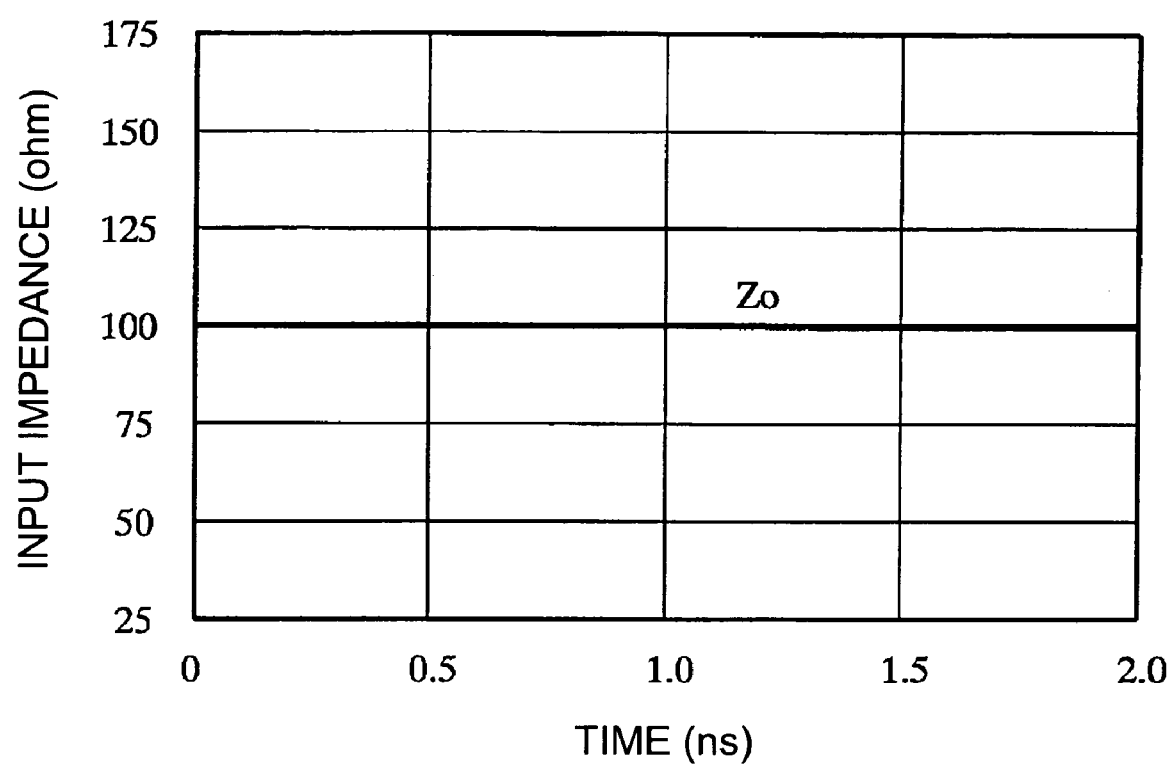
FIG. 13 is a chart showing S-parameter test results of the surge absorption circuit of the present invention.

FIG. 13 shows results of the TDR test. In FIG. 13, the abscissa and ordinate indicate time (ns) and input impedance (ohm), respectively. FIG. 13 clarifies that the multilayer surge absorption component of this embodiment keeps the input impedance constant.

Figure 14:
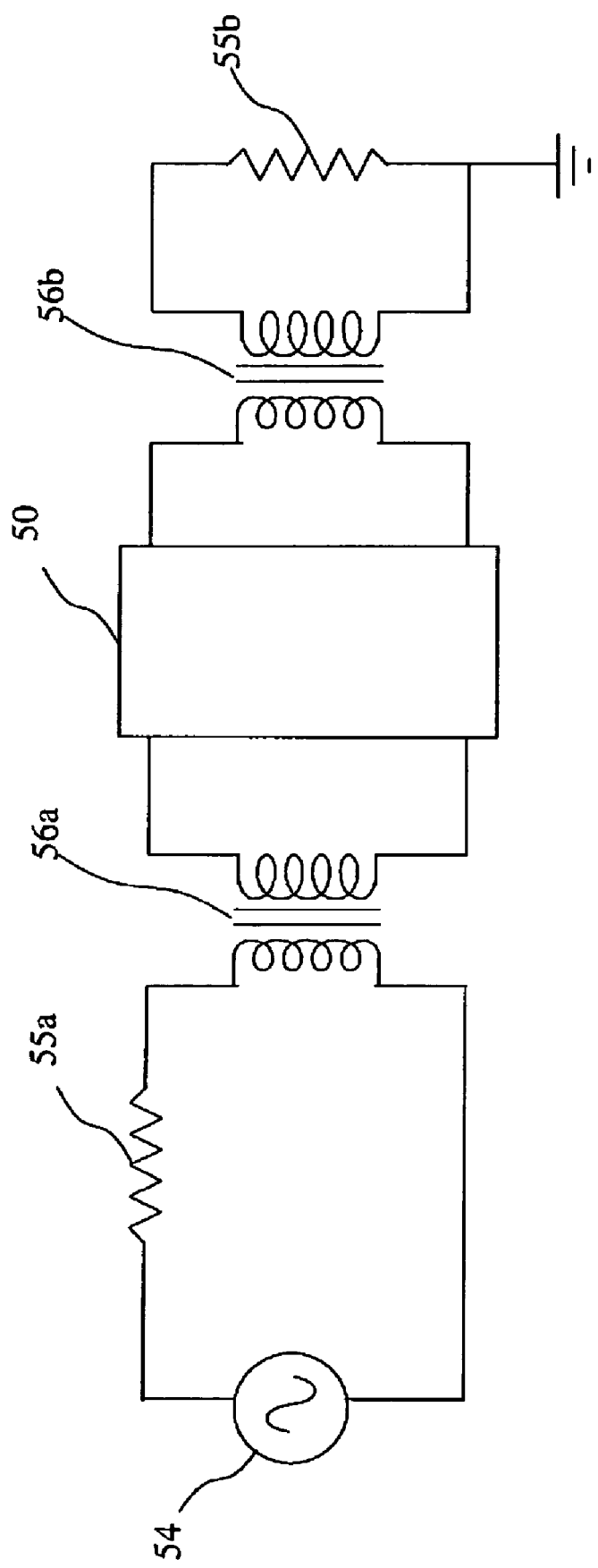
FIG. 14 is a diagram showing the structure of an S-parameter test system.

The above-mentioned multilayer surge absorption component was subjected to an S-parameter test. FIG. 14 shows the structure of the S-parameter test system at that time. The test system shown in FIG. 14 comprises the multilayer surge absorption component 50 to be measured, an oscillator 54, resistors 55a and 55b for impedance matching, an unbalanced-to-balanced transformer 56a, and a balanced-to-unbalanced transformer 56b.

The electrodes of the multilayer surge absorption component shown in FIG. 9 were respectively connected to four terminals as with the multilayer surge absorption component to be measured in FIG. 14. Each of the resistors for impedance matching 55a and 55b was 100 Ω.

Figure 15:
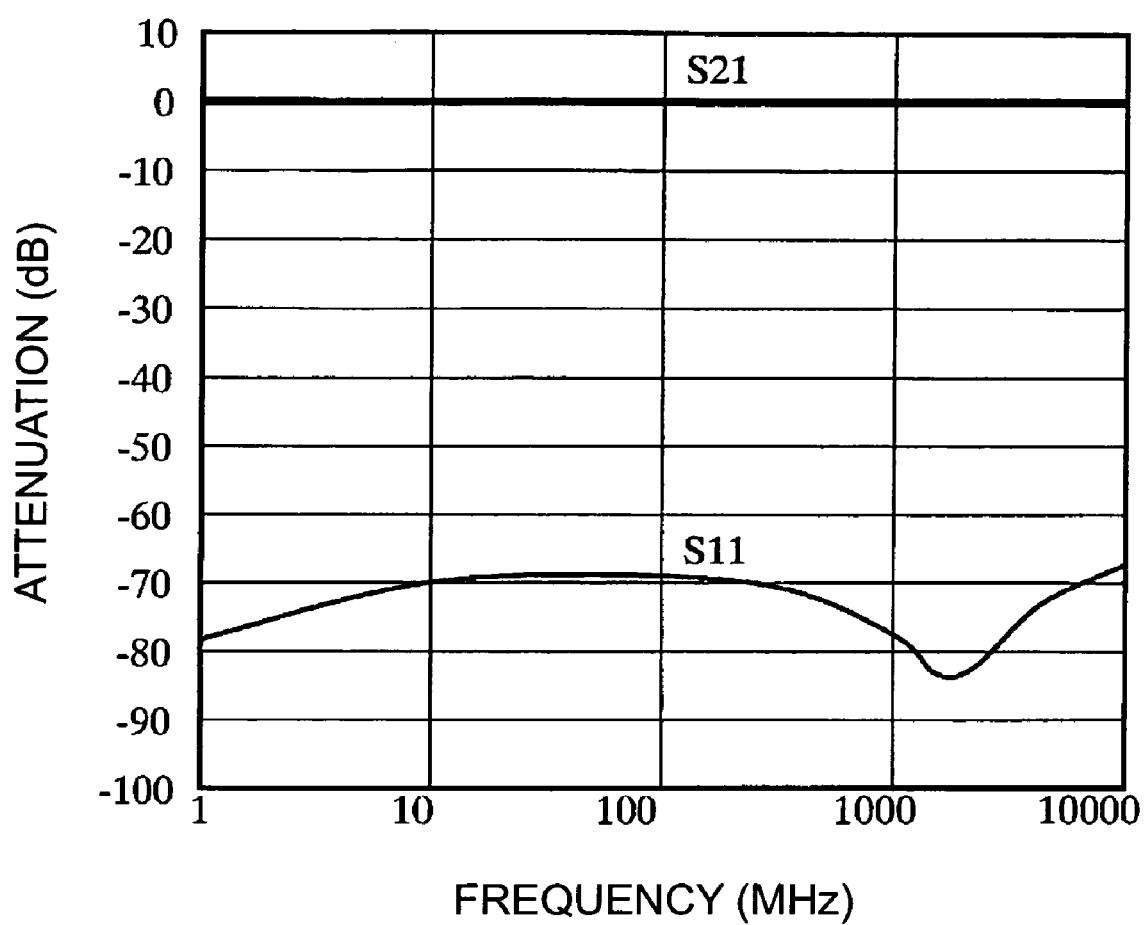
FIG. 15 is a chart showing S-parameter test results of the surge absorption circuit of the present invention.

FIG. 15 shows results of the S-parameter test. In FIG. 15, the abscissa and ordinate indicate frequency (MHz) and attenuation (dB), respectively. FIG. 15 clarifies that the multilayer surge absorption component of this embodiment keeps both of the transmission characteristic (S21) and reflection characteristic (S11) at satisfactory levels.

Therefore, the multilayer surge absorption component having the structure of the surge absorption circuit in accordance with this embodiment can be made small and excellent in impedance matching with respect to high-speed differential signals as well while having a high-performance surge absorbing characteristic.

Second Embodiment

Figure 16:
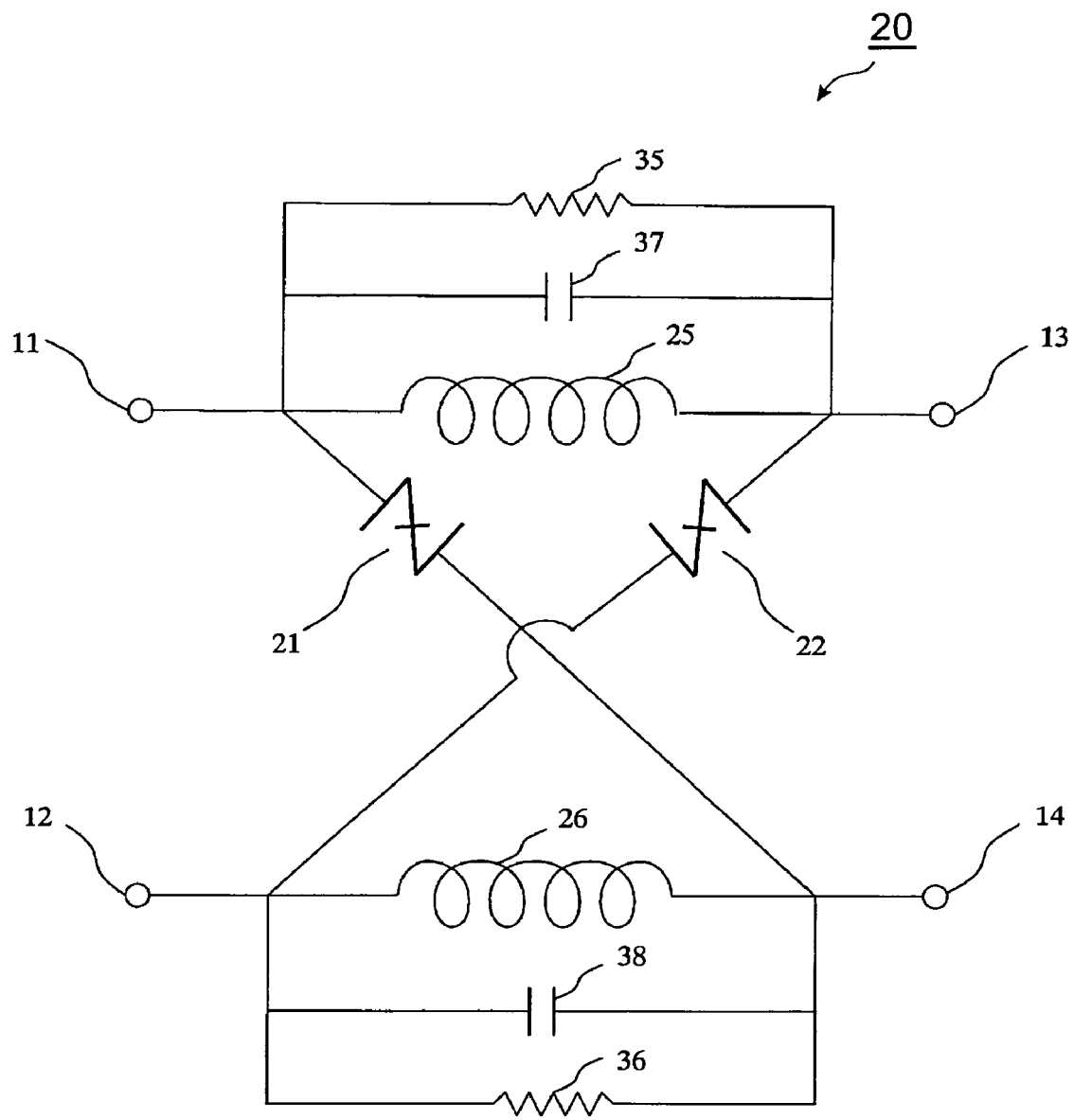
FIG. 16 is a diagram showing the circuit structure of the surge absorption circuit in accordance with an embodiment of the present invention.

FIG. 16 shows the circuit structure of the surge absorption circuit in accordance with an embodiment of the present invention. A surge absorption circuit 20 shown in FIG. 16, one input terminal 11 of differential input terminals, the other input terminal 12 of the differential input terminals, one output terminal 13 of differential output terminals, the other output terminal 14 of the differential output terminals, a first surge absorbing device 21, a second surge absorbing device 22, a first inductor device 25, a second inductor device 26, a third resistor device 35, a fourth resistor device 36, a first capacitor device 37, and a second capacitor device 38.

The surge absorption circuit shown in FIG. 16 has such a structure that the third resistor device 35 and first capacitor device 37 connected in parallel between the input terminal 11 and output terminal 13 and the fourth resistor device 36 and second capacitor device 38 connected in parallel between the input terminal 12 and output terminal 14 are added to the surge absorption circuit 10 shown in FIG. 7.

Though the input terminals 11 and 12 and the output terminals 13 and 14 are distinguished from each other here, the input and output sides are interchangeable. The stray capacitance of each of the first surge absorbing device 21 and second surge absorbing device 22 is Cz, the coefficient of induction (inductance) of each of the first inductor device 25 and second inductor device 26 is Lz, the resistance of each of the third resistor device 35 and fourth resistor device 36 is Rs, and the capacitance of each of the first capacitor device 37 and second capacitor device 38 is Cs.

Figure 17:
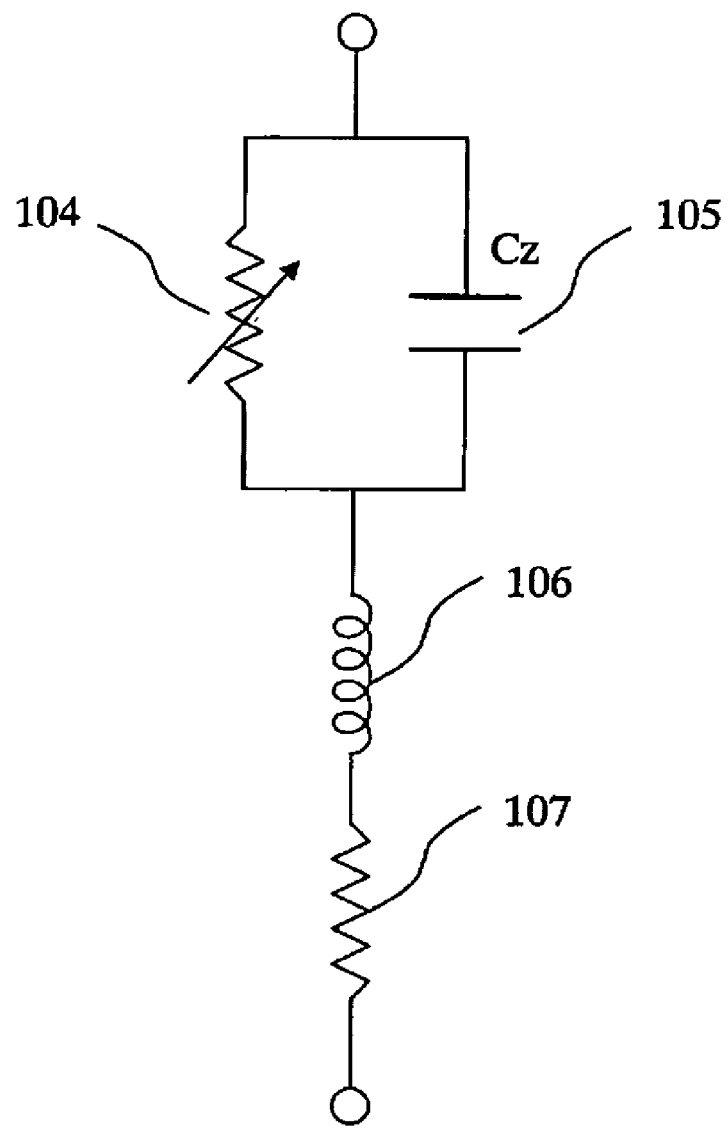
FIG. 17 is a diagram showing the equivalent circuit of a surge absorbing device.

The first surge absorbing device 21 and second surge absorbing device 22 shown in FIG. 16 can be represented by the equivalent circuit shown in FIG. 17. The equivalent circuit shown in FIG. 17 has a variable resistor 104, a stray capacitance 105, an equivalent series inductance component 106, and an equivalent series resistance component 107. Letting Cz be the capacitance of the stray capacitance 105, Lf be the inductance of the equivalent series inductance component 106, and Rf be the equivalent series resistance component 107, the differential input impedance of the surge absorption circuit 20 can be matched with the differential characteristic impedance $Z_{do}$ of a signal line in which the surge absorption circuit is inserted, when the following expressions (7)-(9) are satisfied:

$$Lz = Z_{do}^2 Cz \quad (7)$$

$$Cs = \frac{Lf}{Z_{do}^2} \quad (8)$$

$$Rs = \frac{Z_{do}^2}{Rf} \quad (9)$$

When the equivalent series inductance components are small enough to be negligible in the first and second surge absorbing devices, the first capacitor device 37 and second capacitor device 38 may be omitted form the surge absorption circuit 20 shown in FIG. 16, so that the third resistor device 35 and fourth resistor device 36 cancel the influences of equivalent series resistance components of the first surge absorbing device 21 and second surge absorbing device 22. When the equivalent series resistance components are small enough to be negligible in the first and second surge absorbing devices, the third resistor device 35 and fourth-resistor device 36 may be omitted from the surge absorption circuit 20 shown in FIG. 16, so that the first capacitor device 37 and second capacitor device 38 cancel the influences of equivalent series inductance components of the first surge absorbing device 21 and second surge absorbing device 22.

When the first inductor device 25 and second inductor device 26 have equivalent parallel resistance components and equivalent parallel capacitance components, they may be utilized so as to cancel the influences of equivalent series resistance components and equivalent series inductance components of the first surge absorbing device 21 and second surge absorbing device 22. The parallel sum of the equivalent parallel resistance component of the first inductor device 25 and the third resistor device 35, the parallel sum of the equivalent parallel capacitance component of the first inductor device 25 and the first capacitor device 37, the parallel sum of the equivalent parallel capacitance component of the second inductor device 26 and the fourth resistor device 36, and the parallel sum of the equivalent parallel capacitance component of the second inductor device 26 and the second capacitor device 38 may cancel the influences of equivalent series resistance components and equivalent series inductance components of the first surge absorbing device 21 and second surge absorbing device 22.

Therefore, even when surge absorbing devices have equivalent series inductance components and equivalent series resistance components, the surge absorption circuit of this embodiment can become a surge absorption circuit which is further excellent in impedance matching with respect to high-speed differential signals as well while protecting semiconductor devices and the like against high-voltage static electricity.

An example in which the surge absorption circuit explained with FIG. 16 is realized as a multilayer surge absorption component will now be explained.

Figure 18:
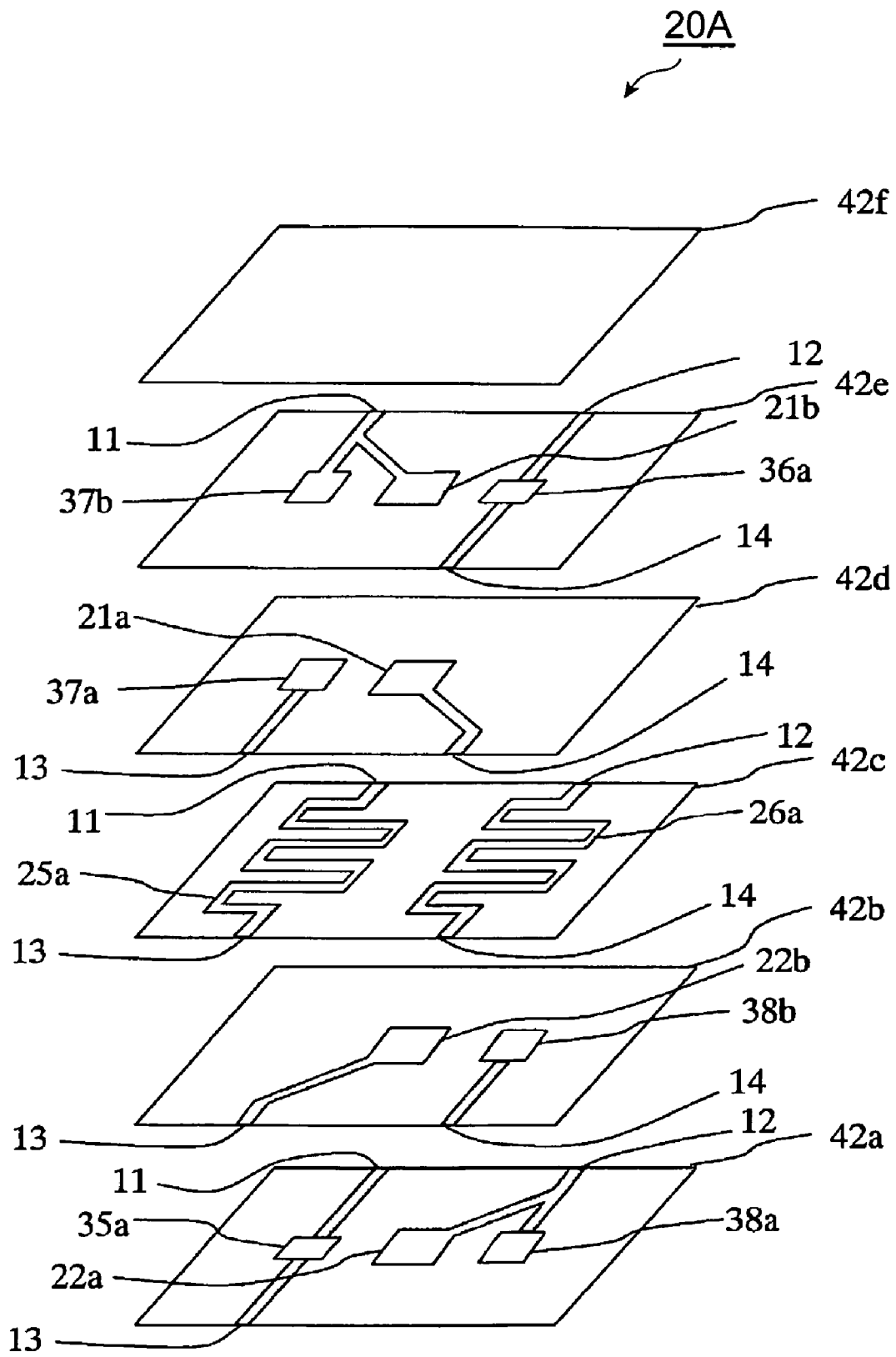
FIG. 18 is a view showing an example in which a multilayer surge absorption component realizing a surge absorption circuit as a multilayer component is exploded into individual layers.

FIG. 18 shows an example in which a multilayer surge absorption component realizing the surge absorption circuit explained with FIG. 16 as a multilayer component is exploded into individual layers. The multilayer surge absorption component 20A shown in FIG. 18 comprises: one input terminal 11 of differential input terminals; the other input terminal 12 of the differential input terminals; one output terminal 13 of differential output terminals; the other output terminal 14 of the differential output terminals; first surge absorbing device patterns 21a and 21b; second surge absorbing device patterns 22a and 22b; a first inductor device pattern 25a; a second inductor device pattern 26a; a third resistor device pattern 35a; a fourth resistor device pattern 36a; first capacitor device patterns 37a and 37b; second capacitor device patterns 38a and 38b; and planar insulating layers 42a, 42b, 42c, 42d, 42e, and 42f.

The multilayer surge absorption component 20A shown in FIG. 18 is one in which the third resistor device pattern 35a, fourth resistor pattern 36a, first capacitor device patterns 37a and 37b, and second capacitor device patterns 38a and 38b are added to the multilayer surge absorption component 10A explained with FIG. 8. The structures and materials of the insulating layers constituting the multilayer surge absorption components 20A shown in FIG. 18 are the same as those in the multilayer surge absorption component 10A shown in FIG. 8.

The multilayer surge absorption component 20A shown in FIG. 18 has the same outer shape as shown in FIG. 9. The input terminal 11, input terminal 12, output terminal 13, and output terminal 14 are respectively connected to the first input electrode 16, second input electrode 17, first output electrode 18, and second output electrode 19.

Namely, in the multilayer surge absorption component 20A, the third resistor device pattern 35a and the second capacitor device pattern 38a are provided on the one main surface of the insulating layer 42a on which the second surge absorbing device pattern 22a is provided. The third resistor device pattern 35a, of which one end 11 and the other end 13 are connected to the input electrode 16 and the output electrode 18, respectively, configures the third resistor device 35. The second capacitor device pattern 38b is provided on the one main surface of the insulating layer 42b on which the second surge absorbing device pattern 22b is provided. The second capacitor device patterns 38a and 38b face to each other via the insulating layer 42b, thereby configuring the second capacitor device 38.

The first capacitor device pattern 37a is provided on one main surface of the insulating layer 42d on which the first surge absorbing device pattern 21a is provided. In addition, the fourth resistor device pattern 36a and the first capacitor device pattern 37b are provided on one main surface of the insulating layer 42e on which the first surge absorbing device pattern 21b is provided. The fourth resistor device pattern 36a, of which one end 12 and the other end 14 are connected to the input electrode 17 and the output electrode 19 respectively, configures the fourth resistor device 36. The first capacitor device patterns 37a and 37b face to each other via the insulating layer 42e, thereby configuring the first capacitor device 37.

Though the first input electrode 16 and second input electrode 17 and the first output electrode 18 and second output electrode 19 are distinguished from each other here, the input and output sides are interchangeable.

Thus completed multilayer surge absorption component is small in size and can reduce the stray capacitance, since the inductor devices and surge absorbing devices are formed integrally. Also, the circuit structure of the above-mentioned surge absorption circuit can yield a multilayer surge absorption component which is excellent in impedance matching with respect to high-speed differential signals as well while protecting semiconductor devices and the like against high-voltage static electricity. Its surge test results are favorable as with the multilayer surge absorption component in accordance with the first embodiment.

Third Embodiment

Figure 19:
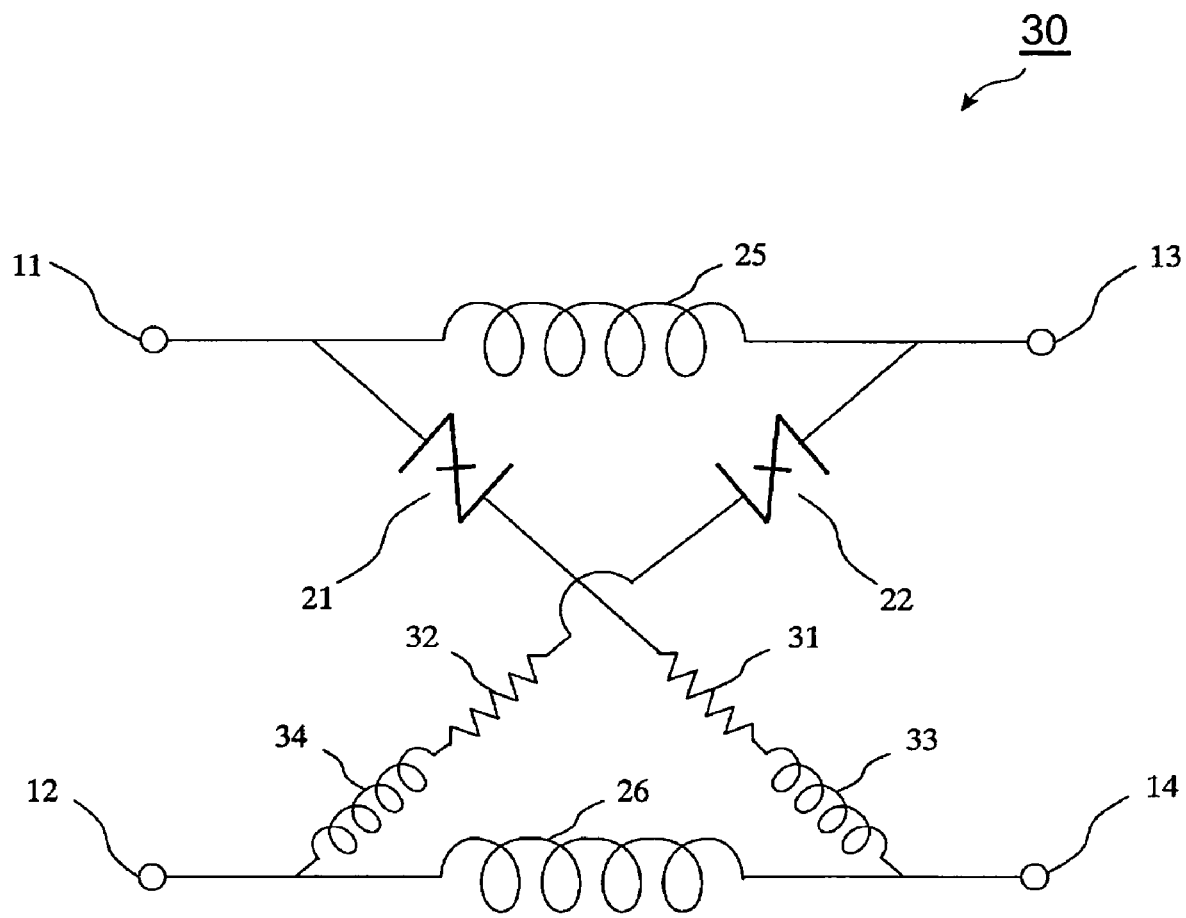
FIG. 19 is a diagram showing the circuit structure of the surge absorption circuit in accordance with an embodiment of the present invention.

FIG. 19 shows the circuit structure of the surge absorption circuit in accordance with an embodiment of the present invention. The surge absorption circuit 30 shown in FIG. 19 comprises: one input terminal 11 of differential input terminals; the other input terminal 12 of the differential input terminals; one output terminal 13 of differential output terminals; the other output terminal 14 of the differential output terminals; a first surge absorbing device 21; a second surge absorbing device 22; a first inductor device 25; a second inductor device 26; a first resistor device 31; a second resistor device 32; a third inductor device 33, and a fourth inductor device 34. In the surge absorption circuit 30, the first surge absorbing device 21, the first resistor device 31 and the third inductor device 33 are connected in series, thereby configuring the first surge absorbing portion. In addition, the second surge absorbing device 22, the second resistor device 32 and the fourth inductor device 34 are connected in series, thereby configuring the second surge absorbing portion.

The surge absorption circuit shown in FIG. 19 has such a structure that the first resistor device 31 and third inductor device 33 are connected in series in addition to the first surge absorbing device 21 between the input terminal 11 and output terminal 14, and the second resistor device 32 and fourth inductor device 34 are connected in series in addition to the second surge absorbing device 22 between the input terminal 12 and output terminal 13 in the surge absorption circuit shown in FIG. 7 in the first embodiment.

Though the input terminals 11 and 12 and the output terminals 13 and 14 are distinguished from each other here, the input and output sides are interchangeable. The stray capacitance of each of the first surge absorbing device 21 and second surge absorbing device 22 is Cz, the coefficient of induction (inductance) of each of the first inductor device 25 and second inductor device 26 is Lz, the resistance of each of the first resistor device 31 and second resistor device 32 is Rp, and the inductance of each of the third inductor device 33 and fourth inductor device 34 is Lp.

Figure 20:
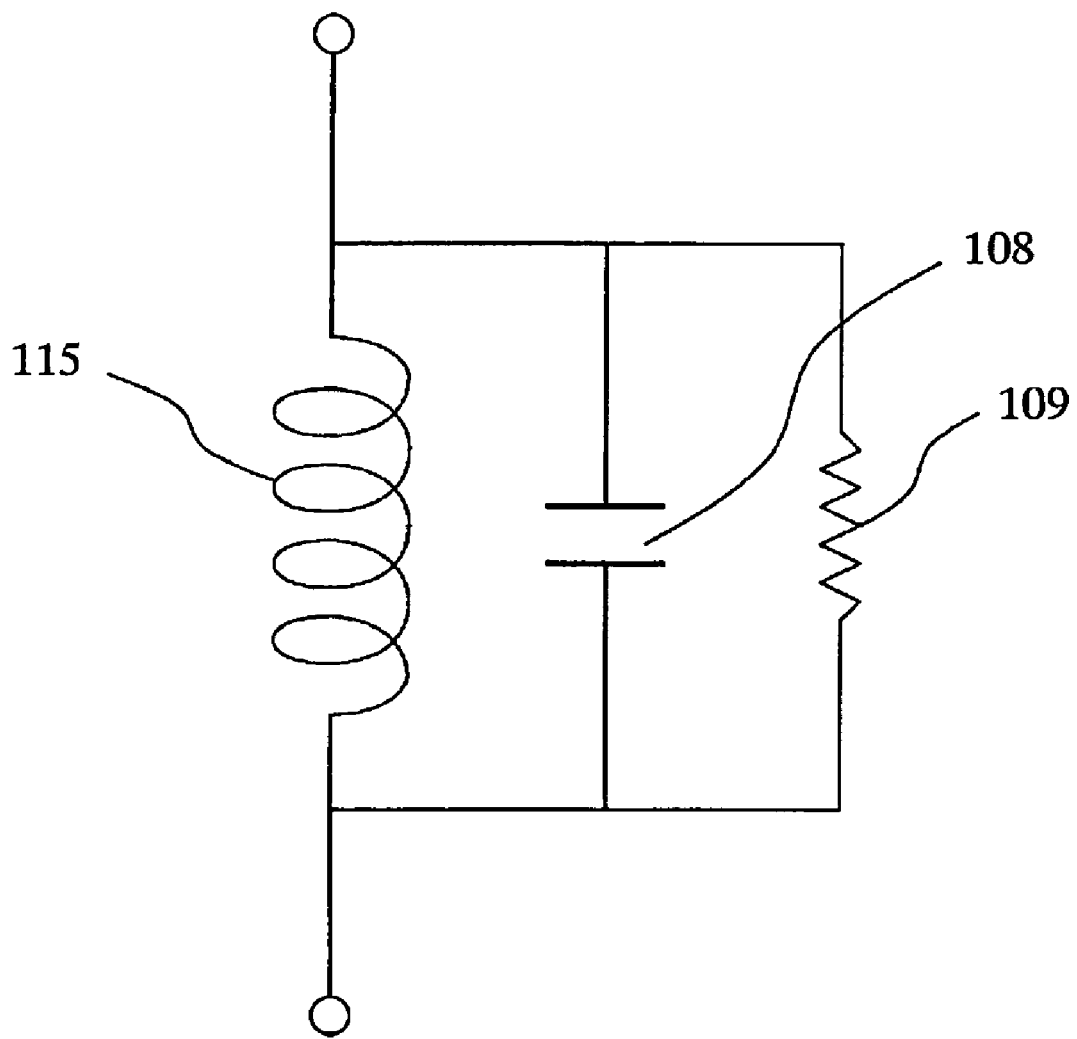
FIG. 20 is a diagram showing the equivalent circuit of an inductor device.

The first inductor device 25 and second inductor device 26 shown in FIG. 19 can be represented by the equivalent circuit shown in FIG. 20. The equivalent circuit shown in FIG. 20 has an inductor device 103, an equivalent parallel capacitance component 108, and an equivalent parallel resistance component 109. Letting Lz be the inductance of the inductor device 103, Ce be the capacitance of the equivalent parallel capacitance component 108, and Re be the resistance of the equivalent parallel resistance component 109, the differential input impedance of the surge absorption circuit 30can be matched with the differential characteristic impedance $Z_{do}$ of a signal line in which the surge absorption circuit is inserted, when the following expressions (10)-(12) are satisfied:

$$Lz = Z_{d0}^2 Cz \quad (10)$$

$$Lp = Z_{d0}^2 Ce \quad (11)$$

$$Rp = \frac{Z_{d0}^2}{Re} \quad (12)$$

When the equivalent parallel capacitance component is small enough to be negligible in the first inductor device 25 or second inductor device 26, the third inductor device 33 and fourth inductor device 34 may be omitted from the surge absorption circuit 30, so that the first resistor device 31 and second resistor device 32 cancel the influences of equivalent parallel resistance components of the first inductor device 25 and second inductor device 26. When the equivalent parallel capacitance component is so smaller than the equivalent parallel resistance component as to be negligible in the first inductor device 25 or second inductor device 26, the first resistor device 31 and second resistor device 32 may be omitted from the surge absorption circuit 30, so that the third inductor device 33 and fourth inductor device 34 cancel the influences of equivalent parallel capacitance components of the first inductor device 25 and second inductor device 26.

When the first surge absorbing device 21 and second surge absorbing device 22 have equivalent series resistance components and equivalent series inductance components, they may be utilized so as to cancel the influences of equivalent parallel resistance components and equivalent parallel capacitance components of the first inductor device 25 and second inductor device 26. The series sum of the equivalent series resistance component of the first surge absorbing device 21 and the first resistor device 31, the series sum of the equivalent series inductance component of the first surge absorbing device 21 and the third inductor device 33, the series sum of the equivalent series resistance component of the second surge absorbing device 22 and the second resistor device 32, and the series sum of the equivalent series inductance component of the second surge absorbing device 22 and the fourth inductor device 34 may cancel the influences of equivalent parallel resistance components and equivalent parallel capacitance components of the first inductor device 25 and second inductor device 26.

Therefore, even when inductor devices have equivalent parallel capacitance components and equivalent parallel resistance components, the surge absorption circuit of this embodiment can become a surge absorption circuit which is further excellent in impedance matching with respect to high-speed differential signals as well while protecting semiconductor devices and the like against high-voltage static electricity.

The surge absorption circuit explained with FIG. 19 is realized as a multilayer surge absorption component as in the first embodiment. The multilayer surge absorption component based on FIG. 19 is small in size and can reduce the stray capacitance, since the inductor devices and surge absorbing devices are formed integrally. Also, the circuit structure of the above-mentioned surge absorption circuit can yield a multilayer surge absorption component which is excellent in impedance matching with respect to high-speed differential signals as well while protecting semiconductor devices and the like against high-voltage static electricity. Its surge test results are favorable as with the multilayer surge absorption component in accordance with the first embodiment.

Fourth Embodiment

Figure 21:
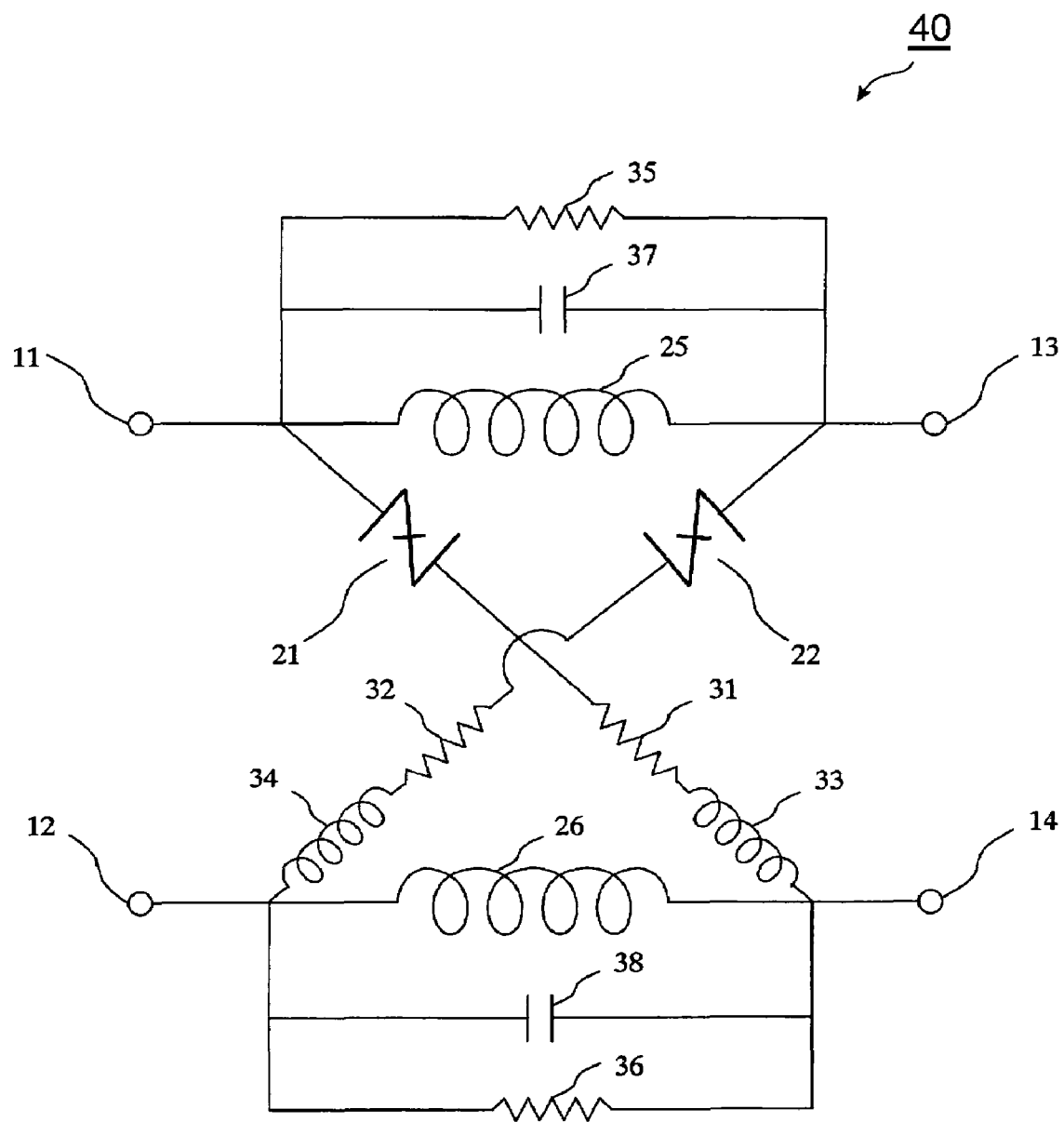
FIG. 21 is a diagram showing the circuit structure of the surge absorption circuit in accordance with an embodiment of the present invention.

FIG. 21 shows the circuit structure of the surge absorption circuit in accordance with an embodiment of the present invention. The surge absorption circuit 30 shown in FIG. 21 comprises: one input terminal 11 of differential input terminals, the other input terminal 12 of the differential input terminals, one output terminal 13 of differential output terminals, the other output terminal 14 of the differential output terminals, a first surge absorbing device 21, a second surge absorbing device 22, a first inductor device 25, a second inductor device 26, a first resistor device 31, a second resistor device 32, a third inductor device 33, a fourth inductor device 34, a third resistor, device 35, a fourth resistor device 36, a first capacitor device 37, and a second capacitor device 38.

The surge absorption circuit 40 shown in FIG. 21 has such a structure that the third resistor device 35 and first capacitor device 37 connected in parallel between the input terminal 11 and output terminal 13 and the fourth resistor device 36 and second capacitor device 38 connected in parallel between the input terminal 12 and output terminal 14 are added to the surge absorption circuit 30 shown in FIG. 19 in the third embodiment.

Though the input terminals 11 and 12 and the output terminals 13 and 14 are distinguished from each other here, the input and output sides are interchangeable. The stray capacitance of each of the first surge absorbing device 21 and second surge absorbing device 22 is Cz, the coefficient of induction (inductance) of each of the first inductor device 25 and second inductor device 26 is Lz, the resistance of each of the third resistor device 35 and fourth resistor device 36 is Rs, the capacitance of each of the first capacitor device 37 and second capacitor device 38 is Cs, the resistance of each of the first resistor device 31 and second resistor device 32 is Rp, and the inductance of each of the third inductor device 33 and fourth inductor device 34 is Lp.

The first inductor device 25 and second inductor device 26 shown in FIG. 21 can be represented by the equivalent circuit shown in FIG. 20, whereas the first surge absorbing device 21 and second surge absorbing device 22 shown in FIG. 21 can be represented by the equivalent circuit shown in FIG. 17. The differential input impedance of the surge absorption circuit 40 can be matched with the differential characteristic impedance $Z_{do}$ of a signal line in which the surge absorption circuit is inserted, when expressions 7 to 12 are satisfied as in the second and third embodiments.

When the equivalent parallel capacitance component is small enough to be negligible in the first inductor device 25 or second inductor device 26, the third inductor device 33 and fourth inductor device 34 may be omitted in FIG. 21, so that the first resistor device 31 and second resistor device 32 cancel the influences of equivalent parallel resistance components of the first inductor device 25 and second inductor device 26. When the equivalent parallel capacitance component is so smaller than the equivalent parallel resistance component as to be negligible in the first inductor device 25 or second inductor device 26, the first resistor device 31 and second resistor device 32 may be omitted in FIG. 21, so that the third inductor device 33 and fourth inductor device 34 cancel the influences of equivalent parallel capacitance components of the first inductor device 25 and second inductor device 26.

When the equivalent series inductance components are small enough to be negligible in the first surge absorbing device 21 and second surge absorbing device 22, the first capacitor device 37 and second capacitor device 38 may be omitted in FIG. 21, so that the third resistor device 35 and fourth resistor device 36 cancel the influences of equivalent series resistance components of the first surge absorbing device 21 and second surge absorbing device 22. When the equivalent series resistance components are small enough to be negligible in the first surge absorbing device 21 and second surge absorbing device 22, the third resistor device 35 and fourth resistor device 36 may be omitted in FIG. 21, so that the first capacitor device 37 and second capacitor device 38 cancel the influences of equivalent series inductance components of the first surge absorbing device 21 and second surge absorbing device 22.

When the first inductor device 25 and second inductor device 26 have equivalent parallel resistance components and equivalent parallel capacitance components, they may be utilized so as to cancel the influences of equivalent series resistance components and equivalent series inductance components of the first surge absorbing device 21 and second surge absorbing device 22. The parallel sum of the equivalent parallel resistance component of the first inductor device 25 and the third resistor device 35, the parallel sum of the equivalent parallel capacitance component of the first inductor device 25 and the first capacitor device 37, the parallel sum of the equivalent parallel capacitance component of the second inductor device 26 and the fourth resistor device 36, and the parallel sum of the equivalent parallel capacitance component of the second inductor device 26 and the second capacitor device 38 may cancel the influences of equivalent series resistance components and equivalent series inductance components of the first surge absorbing device 21 and second surge absorbing device 22.

When the first surge absorbing device 21 and second surge absorbing device 22 have equivalent series resistance components and equivalent series inductance components, they may be utilized so as to cancel the influences of equivalent parallel resistance components and equivalent parallel capacitance components of the first inductor device 25 and second inductor device 26. The series sum of the equivalent series resistance component of the first surge absorbing device 21 and the first resistor device 31, the series sum of the equivalent series inductance component of the first surge absorbing device 21 and the third inductor device 33, the series sum of the equivalent series resistance component of the second surge absorbing device 22 and the second resistor device 32, and the series sum of the equivalent series inductance component of the second surge absorbing device 22 and the fourth inductor device 34 may cancel the influences of equivalent parallel resistance components and equivalent parallel capacitance components of the first inductor device 25 and second inductor device 26.

Therefore, even when inductor devices have equivalent parallel capacitance components and equivalent parallel resistance components, and even when the surge absorbing devices have equivalent series induction components and equivalent series resistance components, the surge absorption circuit of this embodiment can become a surge absorption circuit which is further excellent in impedance matching with respect to high-speed differential signals as well while protecting semiconductor devices and the like against high-voltage static electricity.

The surge absorption circuit 40 explained with FIG. 21 is realized as a multilayer surge absorption component as in the first embodiment. The multilayer surge absorption component based on FIG. 21 is small in size and can reduce the stray capacitance, since the inductor devices and surge absorbing devices are formed integrally. Also, the circuit structure of the above-mentioned surge absorption circuit can yield a multilayer surge absorption component which is excellent in impedance matching with respect to high-speed differential signals as well while protecting semiconductor devices and the like against high-voltage static electricity. Its surge test results are favorable as with the multilayer surge absorption component in accordance with the first embodiment.

Fifth Embodiment

The surge absorption circuit in accordance with an embodiment of the present invention is one in which the first and second inductor devices are inductively coupled to each other in first to fourth embodiments. In the following, one in which the first and second inductor devices in the surge absorption in accordance with the first embodiment are inductively coupled to each other will be explained as an example.

Figure 22:
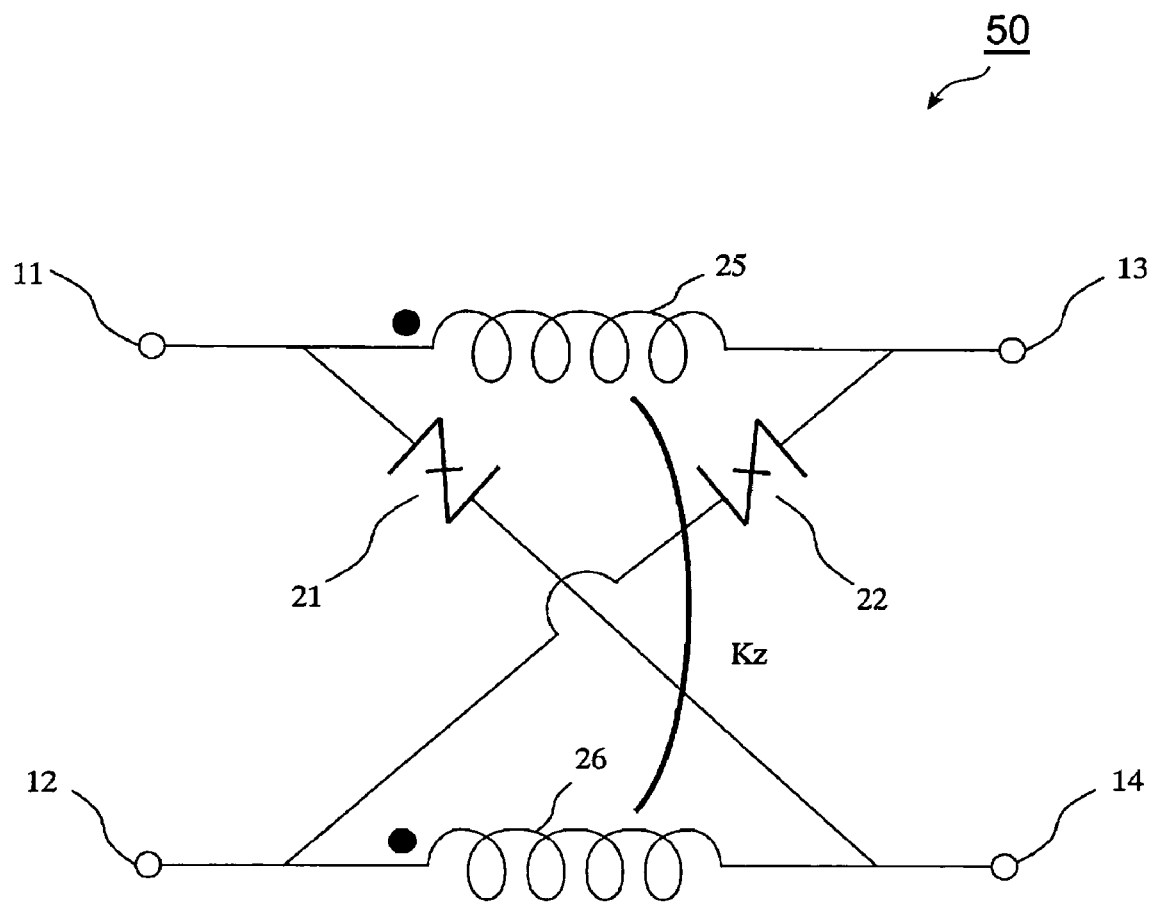
FIG. 22 is a diagram showing the circuit structure of the surge absorption circuit in accordance with an embodiment of the present invention.

FIG. 22 shows the circuit structure of the surge absorption circuit. The surge absorption circuit 50 shown in FIG. 22 comprises: one input terminal 11 of differential input terminals, the other input terminals 12 of the differential input terminals, one output terminal 13 of differential output terminals, the other output terminal 14 of the differential output terminals, a first surge absorbing device 21, a second surge absorbing device 22, a first inductor device 25, and a second inductor device 26.

The surge absorption circuit 50 comprises a pair of input terminals 11 and 12 and a pair of output terminals 13 and 14 for connection to the outside. The first inductor device 25 is connected between the input terminal 11 and output terminal 13, whereas the second inductor device 26 is connected between the input terminal 12 and output terminal 14. The first surge absorbing device 21 is connected between the input terminal 11 and output terminal 14, whereas the second surge absorbing device 22 is connected between the input terminal 12 and output terminal 13. The first inductor device 25 and second inductor device 26 are inductively coupled to each other. The inductive coupling is oriented in such a direction that magnetic fluxes strengthen each other against an input of a common-mode signal to the pair of input terminals 11 and 12.

Though the pair of input terminals 11 and 12 and the pair of output terminals 13 and 14 are distinguished from each other here, the input and output sides are interchangeable. The coefficient of induction (inductance) of each of the first inductor device 25 and second inductor device 26 is Lz. The coupling coefficient between the first inductor device 25 and second inductor device 26 is Kz. Each of the first inductor device 25 and second inductor device 26 may be constituted by a common-mode choke coil.

The surge absorption circuit 50 shown in FIG. 22 keeps impedance matching in the differential mode when satisfying the following expression (13) instead of expressions (5) and (6):

$$Lz = \frac{Z_{d0}^2 Cz}{(1 - Kz)} \quad (13)$$

Therefore, the surge absorption circuit 50 of the present embodiment can become a surge absorption circuit which is excellent in impedance matching with respect to high-speed differential signals as well while protecting semiconductor devices and the like against high-voltage static electricity. Further, common-mode noise can be eliminated.

An example in which the surge absorption circuit 50 explained with FIG. 22 is realized as a multilayer surge absorption component will now be explained.

Figure 23:
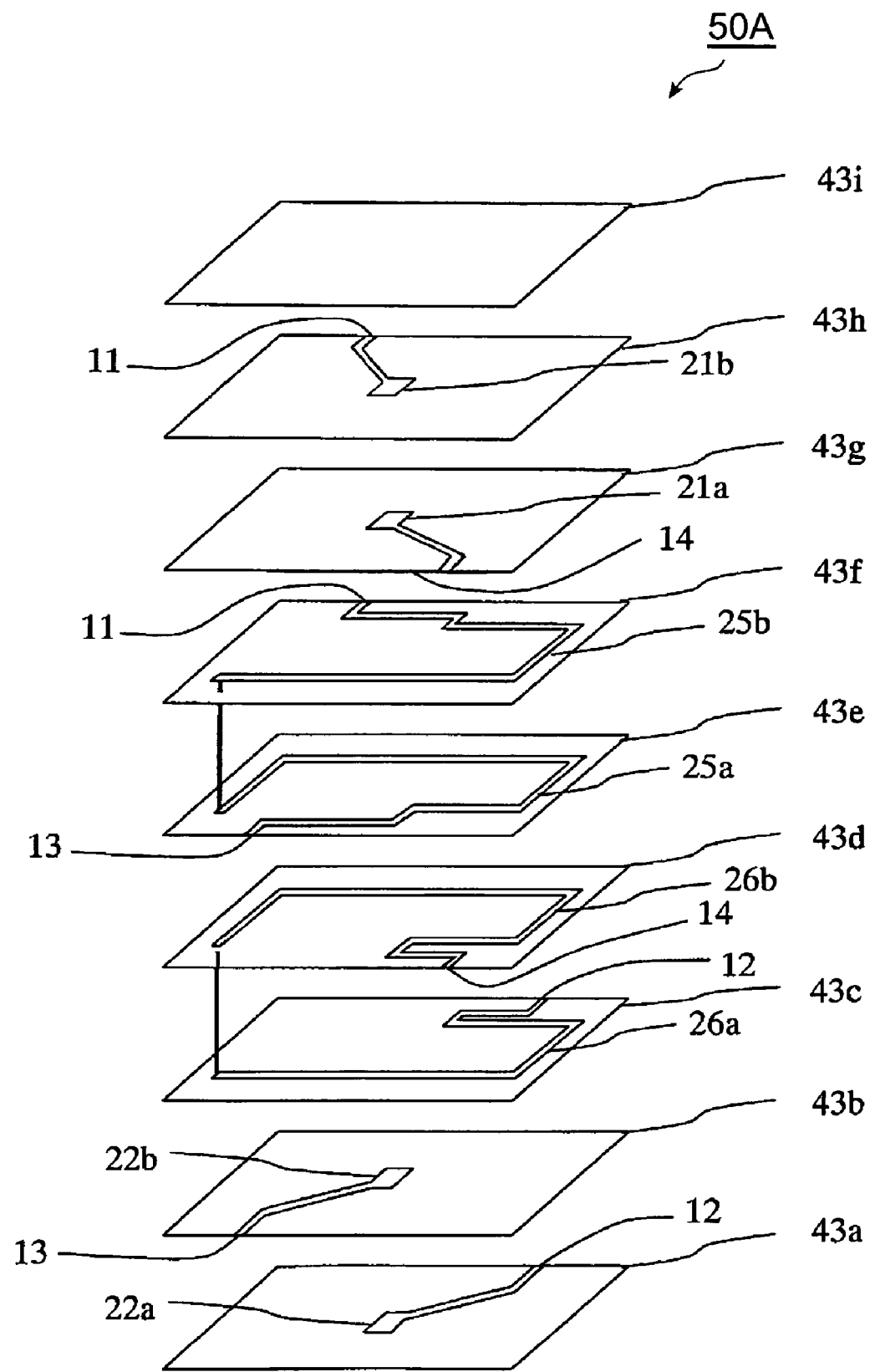
FIG. 23 is a view showing an example in which a multilayer surge absorption component realizing a surge absorption circuit as a multilayer component is exploded into individual layers.

FIG. 23 shows an example in which a multilayer surge absorption component realizing the surge absorption circuit explained with FIG. 22 as a multilayer component is exploded into individual layers. The multilayer surge absorption component 50A shown in FIG. 23 comprises: one input terminal 11 of differential input terminals; the other input terminal 12 of the differential input terminals; one output terminal 13 of differential output terminals; the other output terminal 14 of the differential output terminals; first surge absorbing device patterns 21a and 21b; second surge absorbing device patterns 22a and 22b; first inductor device patterns 25a and 25b; second inductor device patterns 26a and 26b; and planar insulating layers 43a, 43b, 43c, 43d, 43e, 43f, 43g, 43h, and 43i.

The multilayer surge absorption component 50 has the same outer shape as explained with FIG. 9. The input terminal 11, input terminal 12, output terminal 13, and output terminal 14 explained with FIG. 23 are connected to the first input electrode 16, second input electrode 17, first output electrode 18, and second output electrode 19 shown in FIG. 9, respectively. Though the first input electrode 16 and second input electrode 17 and the first output electrode 18 and second output electrode 19 are distinguished from each other here, the input and output sides are interchangeable.

In FIG. 23, the surface (i.e. one main surface) of the insulating layer 43a is formed with the second surge absorbing device pattern 22a, whereas the input terminal 12 is connected to the second input electrode 17 provided on the surface of the multilayer surge absorption component explained with FIG. 9. The surface (i.e. one main surface) of the insulating layer 43b is formed with the second surge absorbing device pattern 22b, whereas the output terminal 13 is connected to the first output electrode 18 provided on the surface of the multilayer surge absorption component explained with FIG. 9.

The surface (i.e. one main surface) of the insulating layer 43c is formed with the second inductor device pattern 26a, whereas the other input terminal 12 of the pair of input terminals is connected to the second input electrode 17 provided on the surface of the multilayer surge absorption component explained with FIG. 9. The surface (i.e. one main surface) of the insulating layer 43d is formed with the second inductor device pattern 26b, whereas the other output terminal 14 of the pair of output terminals is connected to the second output electrode 19 provided on the surface of the multilayer surge absorption component explained with FIG. 9. The second inductor device pattern 26a of the insulating layer 43c and the second inductor device pattern 26b on the surface of the insulating layer 43d are connected to each other through a via hole electrode. The coiled pattern formed by the second inductor device patterns 26a and 26b configures the second inductor device 26.

The surface (i.e. one main surface) of the insulating layer 43e is formed with the first inductor device pattern 25a, whereas the other output terminal 13 of the pair of output terminals is connected to the first output electrode 18 provided on the surface of the multilayer surge absorption component explained with FIG. 9. The surface (i.e. one main surface) of the insulating layer 43f is formed with the first inductor device pattern 25b, whereas one input terminal 11 of the pair of input terminals is connected to the first input electrode 16 provided on the surface of the multilayer surge absorption component explained with FIG. 9. The first inductor device pattern 25a of the insulating layer 43e and the first inductor device pattern 25b on the surface of the insulating layer 43f are connected to each other through a via hole electrode. The coiled pattern formed by the first inductor device patterns 25a and 25b configures the first inductor device 25.

The first inductor device patterns 25a and 25b and the second inductor device patterns 26a and 26b are inductively coupled to each other with a coupling coefficient Kz. Namely, the coiled pattern formed by the first inductor device patterns 25a and 25b and the coiled pattern formed by the second inductor device patterns 26a and 26b are inductively coupled to each other. For example, these coiled patterns are arranged coaxially, thereby being inductively coupled.

The surface (i.e. one main surface) of the insulating layer 43g is formed with the first surge absorbing device pattern 21a, whereas the output terminal 14 is connected to the second output electrode 19 provided on the surface of the multilayer surge absorption component explained with FIG. 9. The surface (i.e. one main surface) of the insulating layer 43h is formed with the first surge absorbing device pattern 21b, whereas the input terminal 11 is connected to the first input electrode 16 provided on the surface of the multilayer surge absorption component explained with FIG. 9. The insulating layer 43i prevents the inner device patterns from coming into contact with the outside. Each of the first inductor device patterns 25a and 25b and second inductor device patterns 26a and 26b is formed by a single layer in this example, but may also be constructed by a plurality of layers. Forming with a plurality of layers can realize a large coefficient of induction.

The multilayer surge absorption component 50A shown in FIG. 23 is small in size and can reduce the stray capacitance, since the inductor devices and surge absorbing devices are formed integrally. Also, the circuit structure of the above-mentioned surge absorption circuit can yield a multilayer surge absorption component which is excellent in impedance matching with respect to high-speed differential signals as well while protecting semiconductor devices and the like against high-voltage static electricity. Its surge test results are favorable as with the multilayer surge absorption component in accordance with the first embodiment.

The above-mentioned multilayer surge absorption component 50A was subjected to the S-parameter test. The electrodes of the multilayer surge absorption component 50A shown in FIG. 23 were respectively connected to four terminals as with the multilayer surge absorption component to be measured in FIG. 14. Each of resistors for impedance matching 55a and 55b was 100 Ω

Figure 24:
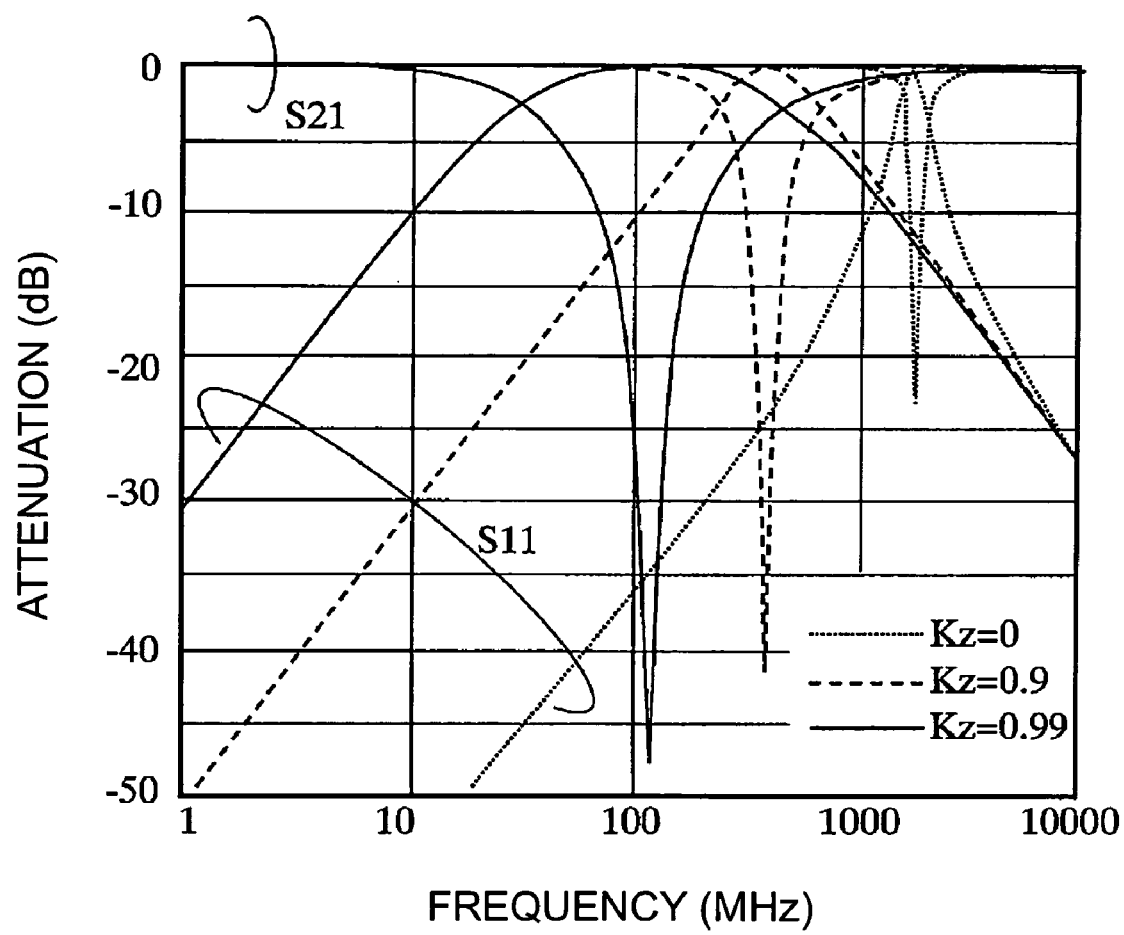
FIG. 24 is a chart showing S-parameter test results of the surge absorption circuit of the present invention.

FIG. 24 shows results of the S-parameter test with the coupling coefficient Kz as a parameter. In FIG. 24, the abscissa and ordinate indicate frequency (MHz) and attenuation (dB), respectively. The transmission characteristic (S21) and reflection characteristic (S11) shown in FIG. 24 clarify that the multilayer surge absorption component 50A of this embodiment can eliminate common-mode noise at a given frequency when the coupling coefficient Kz is selected.

Therefore, the multilayer surge absorption component having the structure of the surge absorption circuit in accordance with this embodiment can be made small and excellent in impedance matching with respect to high-speed differential signals as well while having a high-performance surge absorbing characteristic. It is also effective in eliminating common-mode noise.

Though the foregoing explanation describes one which couples the first inductor device and second inductor device to each other in the surge absorption circuit in accordance with the first embodiment as an example, common-mode noise can be eliminated similarly when the first and second inductor devices are coupled to each other in any of the surge absorption circuits in accordance with the second to fourth embodiments.

As described above, the present invention can provide a surge absorption circuit having a flat frequency characteristic over a wide band while protecting semiconductor devices and the like against high-voltage static electricity. The surge absorption circuit in accordance with the present invention can be employed in high-frequency circuit boards mounted with semiconductors.

What is claimed is:

1. A surge absorption circuit comprising:
a pair of input terminals;
a pair of output terminals;
a first inductor device connecting one of the pair of input terminals and one of the pair of output terminals to each other;
a second inductor device connecting the other of the pair of input terminals and the other of the pair of output terminals to each other;
a first surge absorption part having a first surge absorbing device and connected in series between the one of the pair of input terminals and the other of the pair of output terminals; and
a second surge absorption part having a second surge absorbing device and connected in series between the other of the pair of input terminals and the one of the pair of output terminals,
wherein the surge absorption circuit determines a capacitance Cz, an inductance Lz, an impedance $Z_{d0}$ and a coefficient Kz without a frequency, and the inductance Lz is determined to satisfy formula (A), where the Cz is a stray capacitance of each of the first and second surge absorption parts, the Lz is a coefficient of induction of each of the first and second inductor devices, the $Z_{d0}$ is a characteristic impedance of a signal line in which the surge absorption circuit is inserted, the Kz is a coupling coefficient between the first inductor device and the second inductor device and the Kz satisfies 0≦Kz<1

$$Lz = \frac{Z_{d0}^2 Cz}{1 - Kz}. \quad (A)$$

* * * * *